(12) United States Patent
Hayakawa et al.

(10) Patent No.: US 7,777,232 B2
(45) Date of Patent: Aug. 17, 2010

(54) DISPLAY DEVICE AND ELECTRONIC DEVICE USING THE SAME

(75) Inventors: Masahiko Hayakawa, Atsugi (JP); Shuhei Yoshitomi, Ayase (JP); Ryo Tokumaru, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 49 days.

(21) Appl. No.: 11/389,233

(22) Filed: Mar. 27, 2006

(65) Prior Publication Data

US 2006/0228822 A1 Oct. 12, 2006

(30) Foreign Application Priority Data

Apr. 11, 2005 (JP) ............................. 2005-113054

(51) Int. Cl.
*H01L 21/00* (2006.01)
(52) U.S. Cl. .................. 257/79; 257/40; 257/E51.008; 257/E51.011; 257/E51.018; 345/206
(58) Field of Classification Search .......... 257/E51.008, 257/E51.011, E51.018, 40, 79; 345/206
See application file for complete search history.

(56) References Cited

U.S. PATENT DOCUMENTS

| 5,061,569 | A | * | 10/1991 | VanSlyke et al. ............. 428/457 |
| 5,989,737 | A | | 11/1999 | Xie et al. |
| 6,312,837 | B1 | * | 11/2001 | Kijima ........................ 428/690 |
| 6,404,137 | B1 | * | 6/2002 | Shodo ...................... 315/169.1 |
| 6,423,429 | B2 | | 7/2002 | Kido et al. |
| 6,486,601 | B1 | | 11/2002 | Sakai et al. |
| 6,528,951 | B2 | * | 3/2003 | Yamazaki et al. ......... 315/169.3 |
| 6,747,638 | B2 | * | 6/2004 | Yamazaki et al. ........... 345/207 |
| 7,298,347 | B2 | | 11/2007 | Yamazaki et al. |
| 2001/0033252 | A1 | | 10/2001 | Yamazaki |
| 2002/0017643 | A1 | * | 2/2002 | Koyama ....................... 257/59 |
| 2003/0132716 | A1 | * | 7/2003 | Yamazaki et al. ......... 315/169.3 |
| 2003/0189401 | A1 | | 10/2003 | Kido et al. |

(Continued)

FOREIGN PATENT DOCUMENTS

CN 1329368 1/2002

(Continued)

OTHER PUBLICATIONS

Tokito et al., Metal Oxides as hole-injecting layer for organic electroluminescent device, J. Phys. D: Appl. Phys., vol. 29, 1996, pp. 2750-2753.*

(Continued)

*Primary Examiner*—Eugene Lee
*Assistant Examiner*—Peniel M Gumedzoe
(74) *Attorney, Agent, or Firm*—Eric J. Robinson; Robinson Intellectual Property Law Office, P.C.

(57) ABSTRACT

A display device having a first light-emitting element, a second light-emitting element, a constant current source, and an amplifier is provided. Each of the first light-emitting element and the second light-emitting element has a first layer including an organic compound and an inorganic compound and a second layer including a light-emitting substance, which are stacked between a pair of electrodes. The first layer is provided over the second layer. Alternatively, the second layer is provided over the first layer.

25 Claims, 10 Drawing Sheets

U.S. PATENT DOCUMENTS

| | | | |
|---|---|---|---|
| 2004/0100463 A1* | 5/2004 | Miyagawa et al. | 345/212 |
| 2005/0012731 A1* | 1/2005 | Yamazaki et al. | 345/204 |
| 2005/0084712 A1 | 4/2005 | Kido et al. | |
| 2005/0084713 A1 | 4/2005 | Kido et al. | |
| 2005/0098207 A1 | 5/2005 | Matsumoto et al. | |
| 2005/0106419 A1 | 5/2005 | Endoh et al. | |
| 2005/0170208 A1 | 8/2005 | Yatsunami et al. | |
| 2005/0248267 A1 | 11/2005 | Gyoutoku et al. | |
| 2006/0008740 A1 | 1/2006 | Kido et al. | |
| 2006/0022206 A1* | 2/2006 | Hayakawa et al. | 257/82 |
| 2006/0038804 A1* | 2/2006 | Hayakawa et al. | 345/204 |
| 2007/0182317 A1 | 8/2007 | Kido et al. | |

FOREIGN PATENT DOCUMENTS

| | | |
|---|---|---|
| CN | 1447629 | 10/2003 |
| EP | 1 168 291 | 1/2002 |
| EP | 1 351 558 | 10/2003 |
| JP | 03-274695 | 12/1991 |
| JP | 09-063771 | 3/1997 |
| JP | 11-307259 | 11/1999 |
| JP | 11-307264 | 11/1999 |
| JP | 2000-315580 | 11/2000 |
| JP | 2002-333861 | 11/2002 |
| JP | 2005-026121 | 1/2005 |
| JP | 2005-032618 | 2/2005 |
| JP | 2005-251587 | 9/2005 |
| WO | WO 2005/031798 | 4/2005 |

OTHER PUBLICATIONS

Office Action (Application No. 200610071996.0) Dated Aug. 8, 2008.

* cited by examiner

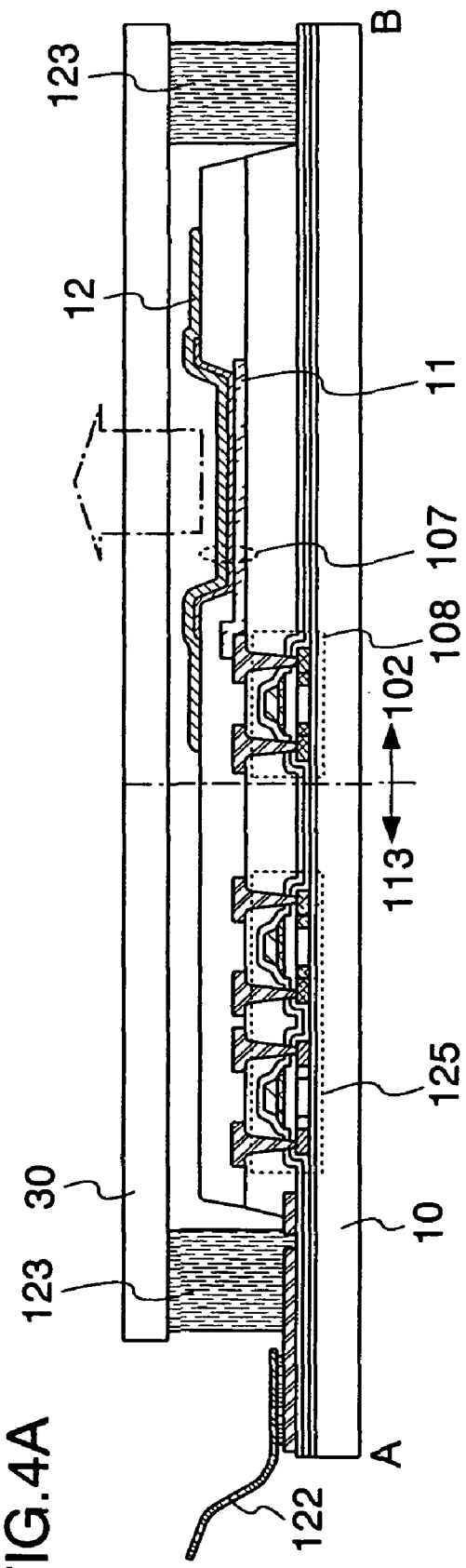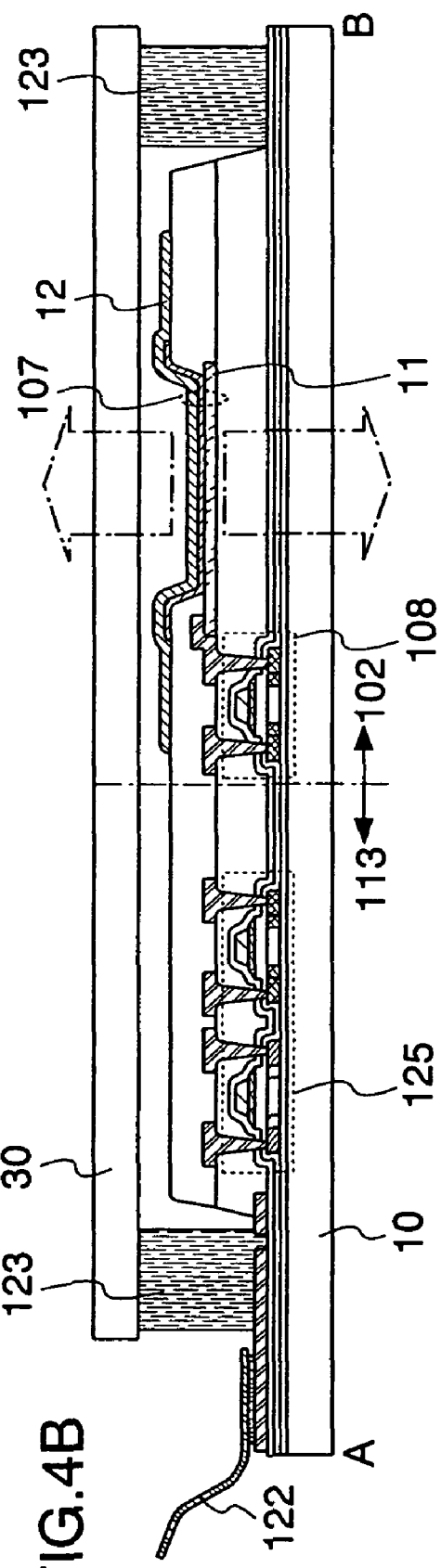

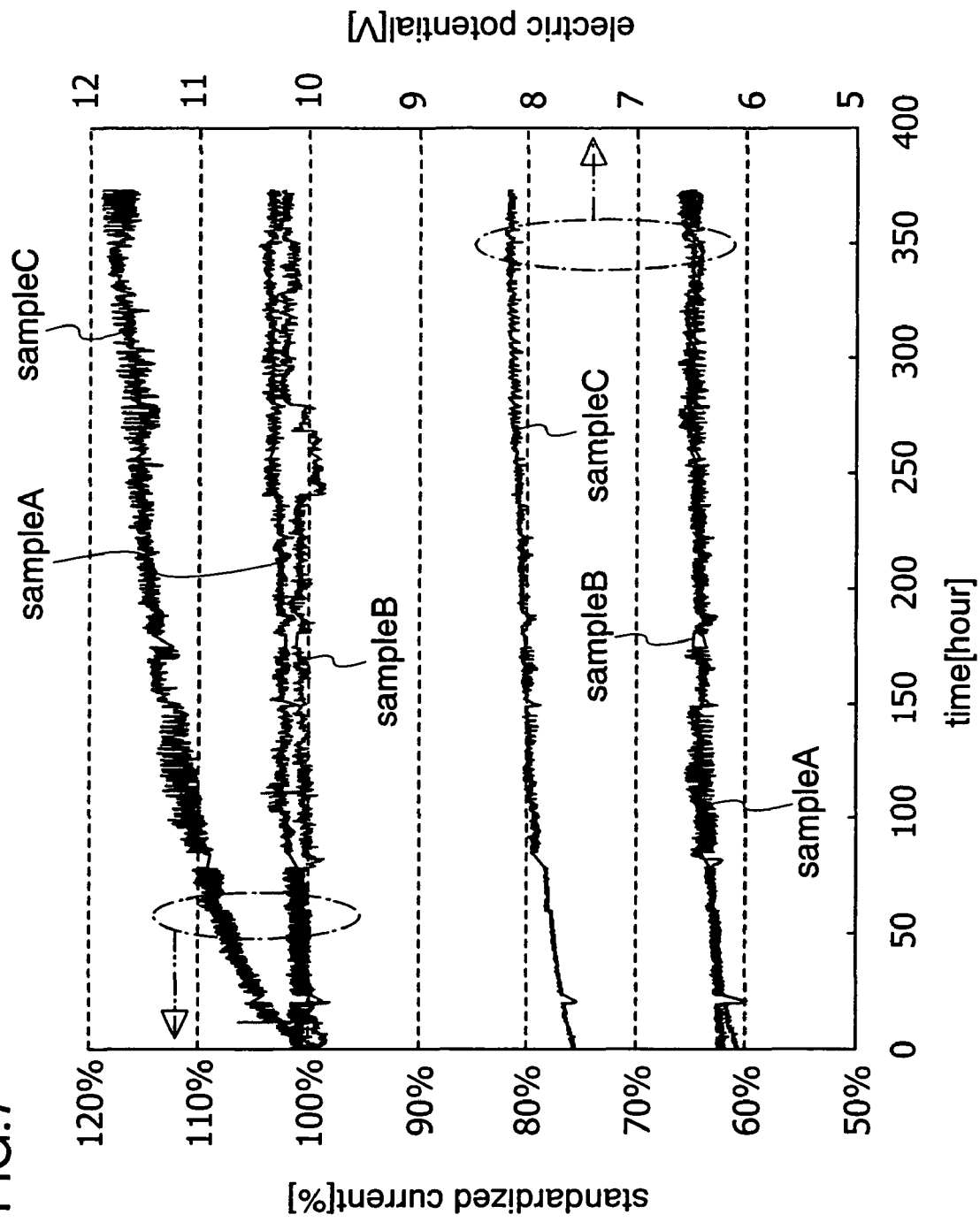

DISPLAY DEVICE AND ELECTRONIC DEVICE USING THE SAME

BACKGROUND OF THE INVENTION

1. Field of the Invention

The present invention relates to a display device including a light-emitting element. Moreover, the invention relates to an electronic device using a display device including a light-emitting element.

2. Description of the Related Art

In recent years, display devices including light-emitting elements typified by EL (Electro Luminescence) elements have been developed, and wide applications thereof are expected because of utilizing the advantages such as high image quality, wide viewing angle, thin shape, and lightweight of a self-light emission type. Luminance of a light-emitting element is proportional to a current value of the light-emitting element.

A light-emitting element has a property that a resistance value is decreased when ambient temperature (hereinafter, also referred to as environmental temperature) becomes high and a resistance value is increased when ambient temperature becomes low, and a property that a resistance value is increased by a change with time. Thus, there is a display device which suppresses an influence of fluctuation in a resistance value of a light-emitting element due to a change in environmental temperature and a change with time (for example, refer to Patent Document 1: Japanese Patent Laid-Open No. 2002-333861).

The display device in Patent Document 1 has a light-emitting element, a monitoring light-emitting element, a constant current source, and a buffer amplifier. A constant current is supplied from the constant current source to the monitoring light-emitting element. One of a plurality of electrodes of the monitoring light-emitting element is connected to one of a plurality of electrodes of the light-emitting element through the buffer amplifier. In this state, if the change in environment temperature and change with time occur, an electric potential of said one of the plurality of electrodes of the monitoring light-emitting element is changed, and this electric potential is transmitted to an electric potential of said one of the plurality of electrodes of the light-emitting element. By changing an electric potential of one of the plurality of electrodes of a light-emitting element depending on the change in environment temperature and change with time in this manner, an influence of fluctuation in resistance value of the light-emitting element can be suppressed.

SUMMARY OF THE INVENTION

In Patent Document 1 described above, if the progress of a change with time is different between a light-emitting element and a monitoring light-emitting element, the change in resistance value due to the change with time is different between the light-emitting element and the monitoring light-emitting element; therefore, an electric potential transmitted to the light-emitting element (hereinafter, also referred to as power supply potential) cannot be corrected accurately. Thus, it is an object of the present invention to provide a display device and an electronic device; the display device can accurately correct an electric potential transmitted to a light-emitting element by using a light-emitting element and a monitoring light-emitting element both of which have the same progress of the change with time.

A display device of the invention has a first light-emitting element (corresponding to a monitoring light-emitting element), a second light-emitting element, a constant current source for supplying a constant current to the first light-emitting element, and a circuit for outputting the same electric potential as an inputted electric potential. A first electrode of the first light-emitting element is connected to an input terminal of the circuit. A first electrode of the second light-emitting element is connected to an output terminal of the circuit. A second electrode of the first light-emitting element and a second electrode of the second light-emitting element are held at a constant electric potential.

Each of the first light-emitting element and the second light-emitting element is an element in which a first conductive layer, a first layer including an organic compound and an inorganic compound, a second layer including a light-emitting substance, and a second conductive layer are sequentially stacked. Alternatively, each of the first light-emitting element and the second light-emitting element is an element in which a first conductive layer, a first layer including a light-emitting substance, a second layer including an organic compound and an inorganic compound, and a second conductive layer are sequentially stacked.

The organic compound is 4,4'-bis[N-(1-naphthyl)-N-phenylamino]biphenyl, 4,4'-bis[N-(3-methylphenyl)-N-phenylamino]biphenyl, 4,4',4'-tris(N,N-diphenylamino) triphenylamine, 4,4',4"-tris[N-(3-methylphenyl)-N-phenylamino] triphenylamine, 4,4'-bis{N-[4-(N,N-di-m-tolylamino) phenyl]-N-phenylamino}biphenyl, 1,3,5-tris[N,N-di(m-tolyl)amino]benzene, 4,4'-bis[N-(4-biphenylyl)-N-phenylamino]biphenyl, 4,4',4"-tris(N-carbazolyl) triphenylamine, 3-[N-(9-phenylcarbazol-3-yl)-N-phenylamino]-9-phenylcarbazole, 3,6-bis[N-(9-phenylcarbazol-3-yl)-N-phenylamino]-9-phenylcarbazole, phthalocyanine, copper phthalocyanine, vanadyl phthalocyanine, or 5,6,11,12-tetraphenyl naphthacene (also referred to as 5,6,11,12-tetraphenyl tetracene). In addition, the inorganic compound is zirconium oxide, hafnium oxide, vanadium oxide, niobium oxide, tantalum oxide, chromium oxide, molybdenum oxide, tungsten oxide, titanium oxide, manganese oxide, or rhenium oxide.

Preferably, the organic compound is 4,4'-bis[N-(1-naphthyl)-N-phenylamino]biphenyl or 5,6,11,12-tetraphenyl naphthacene, and the inorganic compound is molybdenum oxide. Alternatively, the organic compound is 4,4'-bis{N-[4-(N,N-di-m-tolylamino)phenyl]-N-phenylamino}biphenyl and the inorganic compound is molybdenum oxide.

The light-emitting substance is one or more kinds of substances selected from N,N'-dimethylquinacridone, 3-(2-benzothiazoyl)-7-diethylamino coumarin, tris(8-quinolinolato) aluminum, and 9,10-di(2-naphthyl) anthracene.

In the first light-emitting element and the second light-emitting element having the above structure, the progress of a change with time can be made to be the same. Therefore, the electric potential transmitted to the second light-emitting element (electric potential of the second light-emitting element) can be corrected accurately using the first light-emitting element.

The ratio of the total amount of current in the first light-emitting element to the total amount of current in the second light-emitting element is 1:0.2 to 1:1, preferably, 1:0.6 to 1:1. This ratio is a ratio of the total amount of current in a certain period.

The circuit is a buffer amplifier, an input terminal of the circuit is a noninverting input terminal of the buffer amplifier, and an output terminal of the circuit is an inverting input terminal and an output terminal of the buffer amplifier. By using the circuit, fluctuation in electric potential due to voltage drop or the like can be prevented in transmitting an electric potential of the first electrode of the first light-emitting element to the first electrode of the second light-emitting element.

In other words, by using the circuit described above, fluctuation of an electric potential due to voltage drop or the like can be prevented by making the electric potential of the first electrode of the first light-emitting element and the electric potential of the first electrode of the second light-emitting element to be the same electric potential. It is to be noted that transmission means that an electric potential of one node (for example, electric potential of the first electrode) is transmitted to an electric potential of another node (for example, electric potential of the second electrode). After the electric potential is transmitted, the electric potentials of the first electrode and the second electrode are the same.

Further, the first light-emitting element and the second light-emitting element are provided on the same insulating surface. In other words, the first light-emitting element and the second light-emitting element are manufactured under the same condition and through the same step. Therefore, the first light-emitting element and the second light-emitting element have the same characteristics with respect to the change in environmental temperature.

In addition, the first light-emitting element, the second light-emitting element, the constant current source, and the circuit are provided on the same insulating surface. By providing a plurality of circuits on the same insulating surface, the number of ICs connected to outside can be reduced and a display device with small size, thin shape, and lightweight can be provided.

A display device having any of the structures described above is used for an electronic device of the invention.

According to the invention, each of the light-emitting element and the monitoring light-emitting element has a layer including an organic compound and an inorganic compound; therefore, the progress of the change with time in the light-emitting element and the monitoring light-emitting element can be made to be the same. Therefore, the electric potential transmitted to the light-emitting element (namely, electric potential of the light-emitting element) can be corrected accurately using the monitoring light-emitting element.

These and other objects, features, and advantages of the present invention will become more apparent upon reading of the following detailed description along with the accompanied drawings.

BRIEF DESCRIPTION OF THE DRAWING

In the accompanying drawings:

FIGS. 4A and 4B are views showing a display device of the invention;

FIG. 7 is a graph showing a result of experiment;

DETAILED DESCRIPTION OF THE INVENTION

Embodiment modes according to the present invention are described in detail with reference to the drawings. However, it is easily understood by those skilled in the art that the invention is not limited to the following description and embodiments and details herein disclosed can be modified in various ways without departing from the purpose and the scope of the present invention. Therefore, it should be noted that the description of embodiment modes to be given below should not be interpreted as limiting the present invention. Through the drawings of the embodiments, similar components are denoted by similar numerals in the following description.

Figure 1:
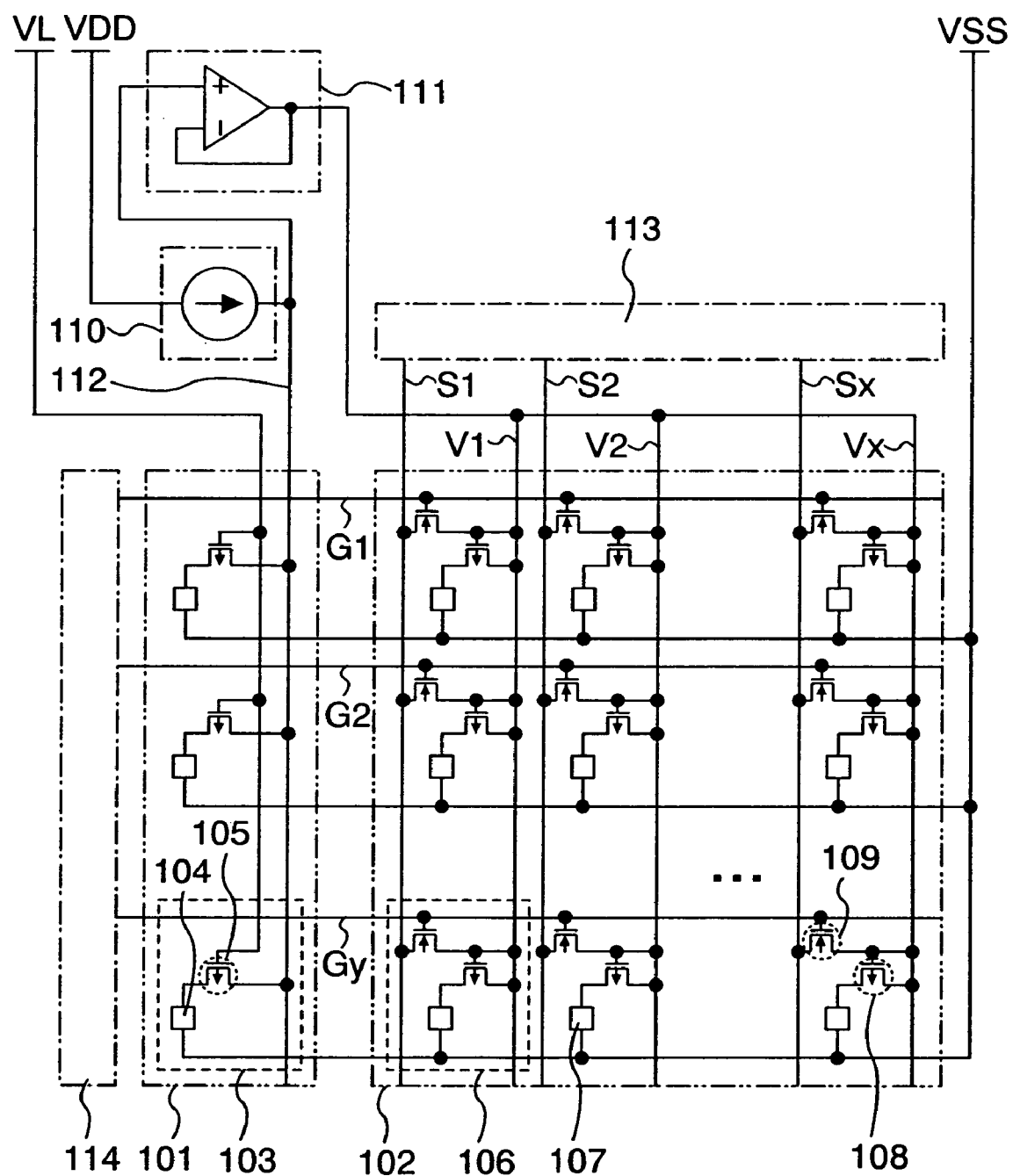
FIG. 1 is a diagram showing a display device of the present invention.
Figure 2A:
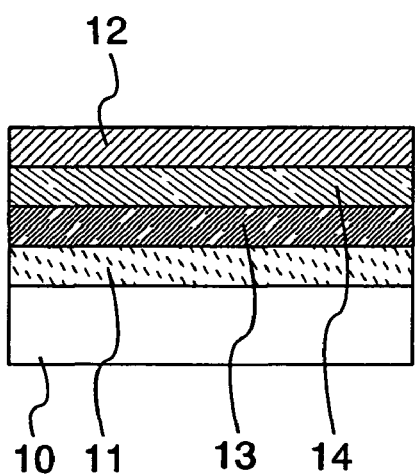
FIGS. 2A to 2D are views showing a display device of the invention.
Figure 2B:
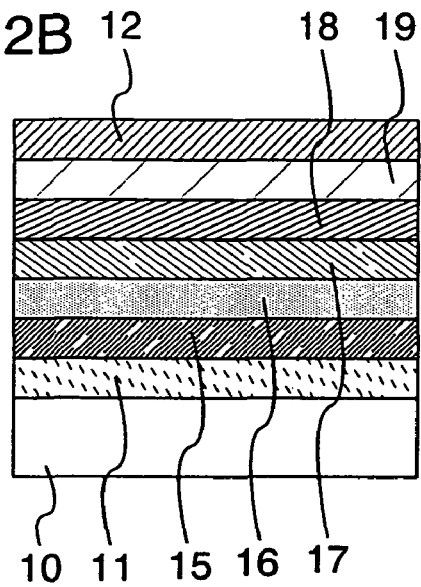
Figure 2C:
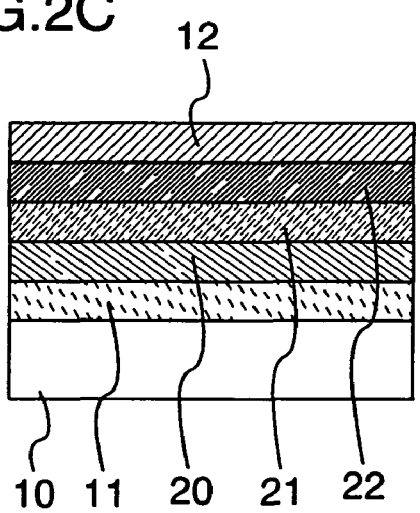
Figure 2D:
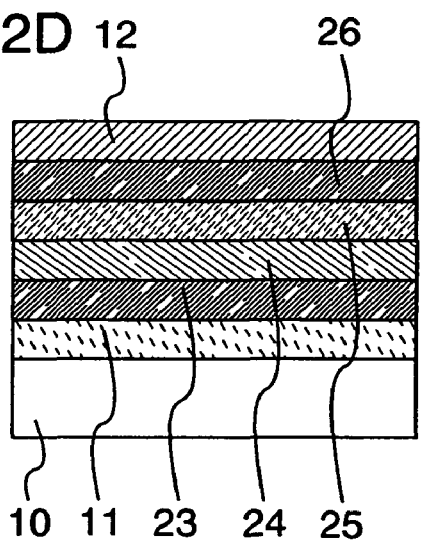

A display device of the invention has a monitoring light-emitting element 104, a light-emitting element 107 (also referred to as displaying light-emitting element), a constant current source 110 for supplying a constant current to the monitoring light-emitting element 104, and a circuit 111 for outputting the same electric potential as an inputted electric potential (refer to FIG. 1).

The monitoring light-emitting element 104 is provided in a monitoring pixel 103 included in a monitor portion 101. The monitoring pixel 103 has at least the monitoring light-emitting element 104. In the shown configuration, the monitoring pixel 103 has the monitoring light-emitting element 104 and a transistor 105.

A gate electrode of the transistor 105 is held at a constant electric potential (VL), one of a source electrode and a drain electrode of the transistor 105 is connected to a power supply line 112, and the other of the source electrode and the drain electrode of the transistor 105 is connected to a first electrode of the monitoring light-emitting element 104. A second electrode of the monitoring light-emitting element 104 is held at a constant electric potential (VSS). Both of the gate electrode of the transistor 105 and the second electrode of the monitoring light-emitting element 104 are connected to a wiring. Both of the gate electrode of the transistor 105 and the second electrode of the monitoring light-emitting element 104 are connected to an external power source through the wiring, and accordingly, held at a constant electric potential (VL or VSS).

The transistor 105 is provided in order to control the amount of current flowing to the monitoring light-emitting element 104, and an electric potential (VL) is an electric potential which turns the transistor 105 ON. The monitoring light-emitting element 104 is connected to an input terminal of the circuit 111 through the transistor 105.

The light-emitting element 107 is provided in a pixel 106 included in a pixel portion 102. The pixel 106 has the light-emitting element 107 and at least two transistors. In the shown configuration, the pixel 106 has the light-emitting element 107, a driving transistor 108, and a switching transistor 109. Further, the pixel portion 102 has a plurality of source lines S1 to Sx (x is a natural number), a plurality of gate lines G1 to Gy (y is a natural number), and a plurality of power supply lines (V1 to Vx).

The plurality of source lines S1 to Sx (x is a natural number) is connected to a source driver 113. The plurality of gate lines G1 to Gy (y is a natural number) is connected to a gate driver 114. The source driver 113 supplies a video signal to the pixel 106. The gate driver 114 supplies a selection signal for controlling ON and OFF of the switching transistor 109 to the pixel 106.

The pixel 106 is turned on or off based on the signal supplied from the source driver 113. A gate electrode of the switching transistor 109 is connected to a gate line Gn (n is a natural number, $1 \leq n \leq y$), one of a source electrode and a drain electrode of the switching transistor 109 is connected to a source line Sm (m is a natural number, $1 \leq m \leq x$), and the other of the source electrode and the drain electrode of the switching transistor 109 is connected to a gate electrode of the driving transistor 108. One of a source electrode and a drain electrode of the driving transistor 108 is connected to a power supply line Vm (m is a natural number, $1 \leq m \leq x$), and the other of a source electrode and a drain electrode of the driving transistor 108 is connected to a first electrode of the light-emitting element 107.

A second electrode of the light-emitting element 107 is connected to a wiring. A second electrode of the light-emitting element 107 is connected to the external power source through the wiring, and accordingly, it is held at a constant electric potential (VSS). The first electrode of the light-emitting element 107 is connected to an output terminal of the circuit 111 through the driving transistor 108.

It is to be noted that the monitoring pixel 103 is not limited to the above configuration, and may have another transistor. Further, the pixel 106 is not limited to the above configuration, and may have another transistor. For example, the pixel 106 may have an erasing transistor. One of a source electrode and a drain electrode of the erasing transistor is connected to the gate electrode of the driving transistor, and the other is connected to the source electrode of the driving transistor. In addition, a gate electrode of the erasing transistor is connected to a gate line which is newly provided.

The pixel 106 may have an erasing diode. One of terminals of the erasing diode is connected to the gate electrode of the driving transistor, and the other of the terminals is connected to a wiring held at a constant electric potential. As the erasing diode, a rectifying element such as a PN diode, a PIN diode, or a transistor in which a gate electrode and a drain electrode are connected may be used. The pixel 106 may have a capacitor element which holds a voltage between the gate electrode and the source electrode of the driving transistor 108.

The circuit 111 is a circuit in which an electric potential inputted to the input terminal is the same as an electric potential outputted from the output terminal, and for example, corresponds to a buffer amplifier. The input terminal of the circuit 111 corresponds to a noninverting input terminal of the buffer amplifier, and the output terminal of the circuit 111 corresponds to an inverting input terminal and an output terminal of the buffer amplifier.

The circuit 111 corresponds to, for example, an operational amplifier or a sense amplifier.

Next, an operation of the display device of the invention having the above configuration will be explained.

A constant current is supplied from the constant current source 110 to the monitoring light-emitting element 104. Therefore, the monitoring light-emitting element 104 conducts constant current driving by which a current value between both electrodes is constant. When there is a change in environmental temperature or a change with time in this state, a resistance value of the monitoring light-emitting element 104 is changed. Since a current value of the monitoring light-emitting element 104 is constant at all times, when the resistance value of the monitoring light-emitting element 104 is changed, electric potential difference between both electrodes of the monitoring light-emitting element 104 is changed.

In the shown configuration, an electric potential of the second electrode of the monitoring light-emitting element 104 is held to be constant; therefore, when the resistance value of the monitoring light-emitting element 104 is changed, an electric potential of the first electrode of the monitoring light-emitting element 104 is changed. The electric potential of the first electrode of the monitoring light-emitting element 104 is transmitted to the input terminal of the circuit 111.

The circuit 111 outputs the same electric potential as the electric potential inputted to the input terminal. The electric potential outputted from the circuit 111 is transmitted to the first electrode of the light-emitting element 107 through the power supply lines V1 to Vx and the driving transistor 108. The light-emitting element 107 emits light based on electric potential difference between the electric potential of the power supply lines V1 to Vx and the electric potential (VSS) of the second electrode of the light-emitting element 107.

Thus, according to the invention, an influence of the change in environmental temperature and the change with time can be suppressed by changing an electric potential which is to be applied to the first electrode of the light-emitting element 107 depending on the change in resistance value of the monitoring light-emitting element 104 due to the change in environmental temperature and the change with time. The light-emitting element 107 conducts constant voltage driving by which the light-emitting element 107 is operated based on electric potential difference between both electrodes. Therefore, the driving transistor 108 is preferably operated in a linear region.

It is to be noted that the monitoring light-emitting element 104 and the light-emitting element 107 are at least provided on the same insulating surface. The monitoring light-emitting element 104 and the light-emitting element 107 are formed under the same condition and through the same step. Therefore, the monitoring light-emitting element 104 and the light-emitting element 107 have the same characteristics with respect to the change in environment temperature.

Each of the monitoring light-emitting element 104 and the light-emitting element 107 is an element in which a first conductive layer, a first layer, a second layer, and a second conductive layer are sequentially stacked. One of the first layer and the second layer includes an organic compound and an inorganic compound, and the other includes a light-emitting substance. The monitoring light-emitting element 104 and the light-emitting element 107 have the same progress of the change with time. In other words, the monitoring light-emitting element 104 and the light-emitting element 107 have the same characteristics with respect to its change with time; and accordingly, the electric potential transmitted to the light-emitting element 107 can be corrected accurately using the monitoring light-emitting element 104.

In addition, not only the monitoring light-emitting element 104 and the light-emitting element 107 but also the constant current source 110 and the circuit 111 may also be provided on the same insulating surface. By providing a plurality of circuits on the same insulating surface, the number of ICs connected to outside can be reduced and a display device with small size, thin shape, and lightweight can be provided.

Next, a stacked structure of the monitoring light-emitting element 104 and the light-emitting element 107 on a substrate 10 having an insulating surface will be explained in detail with reference to FIGS. 2A to 2D. Each of the monitoring light-emitting element 104 and the light-emitting element 107 is an element in which a first conductive layer 11, a first layer 13, a second layer 14, and a second conductive layer 12 are sequentially stacked (refer to FIG. 2A). When electric potential difference is generated between the first conductive layer 11 and the second conductive layer 12, the monitoring light-emitting element 104 and the light-emitting element 107 emit light.

Hereinafter, a case where the monitoring light-emitting element 104 and the light-emitting element 107 emit light when an electric potential of the first conductive layer 11 becomes higher than an electric potential of the second conductive layer 12 will be explained. In other words, a case where the first conductive layer 11 is an anode and the second conductive layer 12 is a cathode will be explained.

The first conductive layer 11 can be made by using metal, alloy, an electrically conductive compound, a mixture thereof, or the like. For example, indium tin oxide (ITO), indium tin oxide containing silicon, indium zinc oxide (IZO) in which zinc oxide (ZnO) is mixed into indium oxide, indium oxide added with titanium oxide, gold (Au), platinum (Pt), nickel (Ni), tungsten (W), chromium (Cr), molybdenum (Mo), iron (Fe), cobalt (Co), titanium (Ti), copper (Cu), palladium (Pd), aluminum (Al), aluminum containing silicon, aluminum containing titanium, aluminum containing silicon and copper, nitride of a metal material such as TiN, or the like can be used. In the case where the first conductive layer 11 is used as an anode, the first conductive layer 11 is preferably made of a material having a high work function (work function of 4.0 eV or more).

The first layer 13 is a layer including an organic compound and an inorganic compound. The first layer 13 is a layer including a composite material including an organic compound and an inorganic compound. An organic compound is a substance which is superior in a hole transporting property. An inorganic compound is a substance which shows an electron accepting property with respect to an organic compound.

An inorganic compound used for the first layer 13 is not limited in particular; however, oxide of transition metal is preferable. Specifically, zirconium oxide, hafnium oxide, vanadium oxide, niobium oxide, tantalum oxide, chromium oxide, molybdenum oxide, tungsten oxide, titanium oxide, manganese oxide, or rhenium oxide is preferable.

As the organic compound used for the first layer 13, 4,4'-bis[N-(1-naphthyl)-N-phenylamino]biphenyl (abbreviation: α-NPB), 4,4'-bis[N-(3-methylphenyl)-N-phenylamino]biphenyl (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis{N-[4-(N,N-di-m-tolylamino)phenyl]-N-phenylamino}biphenyl (abbreviation: DNTPD), 1,3,5-tris[N,N-di(m-tolyl)amino]benzene (abbreviation: m-MTDAB), 4,4'-bis[N-(4-biphenylyl)-N-phenylamino]biphenyl (abbreviation: BBPB), 4,4',4''-tris(N-carbazolyl)triphenylamine (abbreviation: TCTA), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), phthalocyanine (abbreviation: H$_2$PC), copper phthalocyanine (abbreviation: CuPc), vanadyl phthalocyanine (abbreviation: VOPc), 5,6,11,12-tetraphenyl naphthacene (abbreviation: rubrene), and the like are given. Among the above-described organic compounds, in particular, an aromatic amine compound (α-NPB, TPD, TDATA, MTDATA, DNTPD, m-MTDAB, BBPB, TCTA, or the like) which generates a hole easily is preferably used.

In addition, as for the first layer 13, it is desirable that absorption of light in a visible light region be as small as possible. Therefore, it is preferable to use an organic compound having a structure represented by the following general formulas (1) to (4). By using the organic compound having the structure represented by the following general formulas (1) to (4), the absorption of light in a visible light region can be reduced and luminous efficiency of a light-emitting element can be improved.

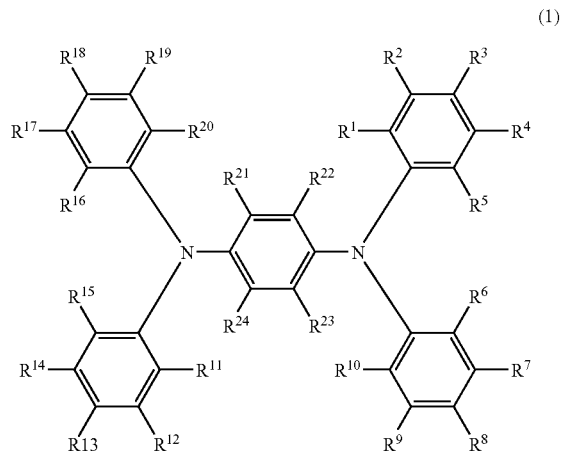

(1)

wherein $R^1$ to $R^{24}$ may be the same or different from one another; and $R^1$ to $R^{24}$ each represent any of hydrogen, an alkyl group, an alkoxy group, an aryl group, and an arylalkyl group.

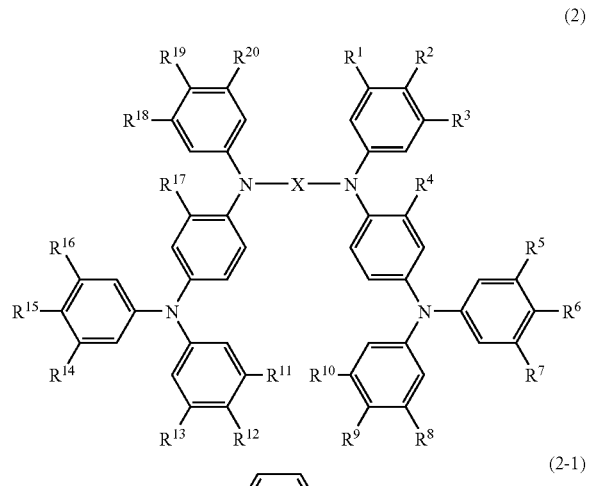

(2)

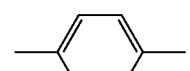

(2-1)

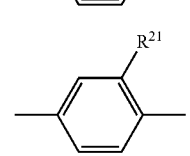

(2-2)

(2-3)

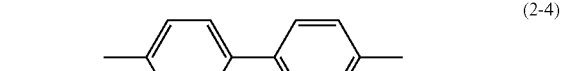

(2-4)

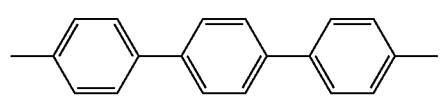

(2-5)

-continued

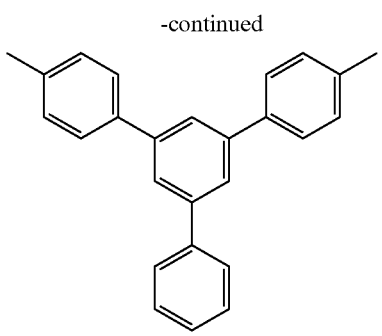

(2-6)

wherein X represents any of aromatic hydrocarbon groups represented by structural formulas (2-1) to (2-6); $R^1$ to $R^{20}$ may be the same or different from one another; and $R^1$ to $R^{20}$ each represent any of hydrogen, an alkyl group, an alkoxy group, and an aryl group.

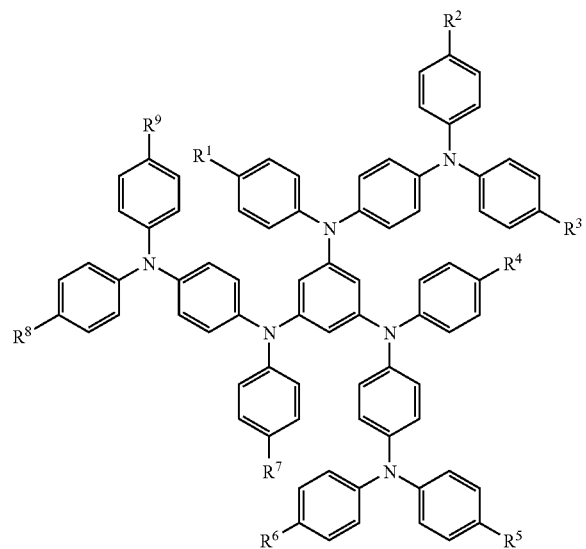

(3)

wherein $R^1$ to $R^9$ may be the same or different from one another; and $R^1$ to $R^9$ each represent any of hydrogen, an alkyl group, an alkoxy group, and an aryl group.

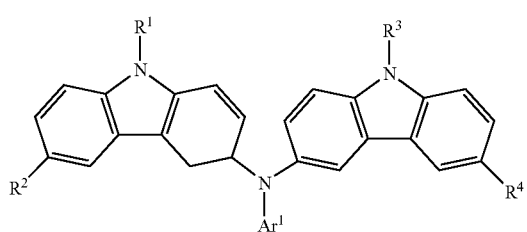

(4)

wherein $R^1$ and $R^3$ may be the same or different from each other; $R^1$ and $R^3$ each represent any of hydrogen, an alkyl group of carbon number 1 to 6, an aryl group of carbon number 6 to 25, a heteroaryl group of carbon number 5 to 9, an arylalkyl group, and an acyl group of carbon number 1 to 7; $Ar^1$ represents any of an aryl group of carbon number 6 to 25 and a heteroaryl group of carbon number 5 to 9; $R^2$ represents any of hydrogen, an alkyl group of carbon number 1 to 6, and an aryl group of carbon number 6 to 12; and $R^4$ represents any of hydrogen, an alkyl group of carbon number 1 to 6, an aryl group of carbon number 6 to 12, and a substituent represented by formula (5).

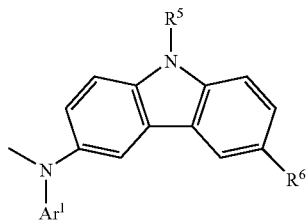

(5)

wherein $R^5$ represents any of hydrogen, an alkyl group of carbon number 1 to 6, an aryl group of carbon number 6 to 25, a heteroaryl group of carbon number 5 to 9, an arylalkyl group, and an acyl group of carbon number 1 to 7; $Ar^1$ represents any of an aryl group of carbon number 6 to 25 and a heteroaryl group of carbon number 5 to 9; and $R^6$ represents any of hydrogen, an alkyl group of carbon number 1 to 6, and an aryl group of carbon number 6 to 12.

The property of the organic compound is changed by a thermal effect; therefore, it is preferable that the organic compound has a high glass transition temperature (Tg), and specifically, from 50° C. to 300° C., preferably, from 80° C. to 120° C. In particular, by using an organic compound having a structure represented by the general formula (4), absorption in a visible light region is weak and a glass transition point (Tg) is high. Hence, by using the organic compound having the structure represented by the general formula (4), a light-emitting element which is superior in heat resistance and improved in reliability can be provided. Further, as the first layer 13, a single layer made of the above material may be provided or a plurality of layers made of the above materials may be stacked.

The second layer 14 is a layer including a light-emitting substance. The light-emitting substance is, for example, a substance formed by freely combining a substance having a high light-emitting property such as N,N'-dimethylquinacridone (abbreviation: DMQd), 3-(2-benzothiazoyl)-7-diethylamino coumarin (abbreviation: coumarin 6) and a substance having a high carrier transporting property and a favorable film quality (that is, which is not easily crystallized) such as tris(8-quinolinolato) aluminum (abbreviation: $Alq_3$) and 9,10-di(2-naphthyl) anthracene (abbreviation: DNA). Further, since $Alq_3$ and DNA are substances which also have a high light-emitting property, the second layer 14 may be a single layer using each of these substances. In addition, as the second layer 14, a single layer made of the above material may be provided or a plurality of layers made of the above materials may be stacked.

The second conductive layer 12 can be made by using various kinds of metal, alloy, an electrically conductive compound, a mixture thereof, or the like. For example, an element belonging to Group 1 or Group 2 in the periodic table, namely, alkali metal such as lithium (Li) or cesium (Cs), alkaline earth metal such as magnesium (Mg), calcium (Ca), or strontium (Sr), and alloy containing these metal (Mg:Ag, Al:Li) are given. When the second conductive layer 12 is used as a cathode, it is preferable that the second conductive layer 12 be made of a material having a low work function (work function of 3.8 eV or lower). Further, by providing a layer having a function of promoting electron injection between the second layer 14 and the second conductive layer 12 so as to be in contact with the second conductive layer 12, various conductive materials such as Al, Ag, ITO, and ITO containing silicon can be used regardless of a work function level.

Next, a stacked structure of the monitoring light-emitting element 104 and the light-emitting element 107, which is different from the above, will be explained. Each of the monitoring light-emitting element 104 and the light-emitting element 107 is an element in which a first conductive layer 11, a first layer 15, a second layer 16, a third layer 17, a fourth layer 18, a fifth layer 19, and a second conductive layer 12 are stacked (refer to FIG. 2B).

The first layer 15 is a layer including an organic compound and an inorganic compound. The first layer 15 is made of the same material as the first layer 13 described above.

The second layer 16 is a layer including a substance having a high hole transporting property. The substance having a high hole transporting property corresponds to an aromatic amine-based (in other words, having a bond of benzene ring nitrogen) compound such as 4,4'-bis[N-(1-naphthyl)-N-phenylamino]biphenyl (abbreviation: α-NPB), N,N'-bis(3-methylphenyl)-N,N'-diphenyl-[1,1'-biphenyl]-4-4'-diamine (abbreviation: TPD), 4,4',4"-tris(N,N-diphenylamino)triphenylamine (abbreviation: TDATA), or 4,4',4"-tris[N-(3-methylphenyl)-N-phenylamino]triphenylamine (abbreviation: MTDATA). The substances described here are mainly substances having hole mobility of $10^{-6}$ cm$^2$/Vs or more. However, a substance except for the above substances may be used as long as the substance has a high transporting property of a hole than that of an electron. As for the second layer 16, a single layer made of the above material may be provided or a plurality of layers made of the above materials may be stacked.

The third layer 17 is a layer including a light-emitting substance. The third layer 17 is made of the same material as the second layer 14 described above.

The fourth layer 18 is a layer including a substance having a high electron transporting property. The layer including a substance having a high electron transporting property is, for example, a layer formed by a metal complex or the like having a quinoline skeleton or a benzoquinoline skeleton, such as tris(8-quinolinolato) aluminum (abbreviation: Alq$_3$), tris(5-methyl-8-quinolinolato) aluminum (abbreviation: Almq$_3$), bis(10-hydroxybenzo[h]-quinolinato)beryllium (abbreviation: BeBq$_2$), or bis(2-methyl-8-quinolinolato)-4-phenylphenolato-aluminum (abbreviation: BAlq). In addition, a metal complex or the like having an oxazole-based or thiazole-based ligand, such as bis[2-(2-hydroxyphenyl)-benzoxazolato]zinc (abbreviation: Zn(BOX)$_2$) or bis[2-(2-hydroxyphenyl)-benzothiazolate]zinc (abbreviation: Zn(BTZ)$_2$) can be also used. Further, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproin (abbreviation: BCP), or the like can be used besides a metal complex. The substances described here are mainly substances having electron mobility of $10^{-6}$ cm$^2$/Vs or more. A substance except for the above substances may be used as the fourth layer 18 as long as the substance has a high transporting property of an electron than that of a hole. As for the fourth layer 18, a single layer made of the above material may be provided or a plurality of layers made of the above materials may be stacked.

The fifth layer 19 is a layer including a substance having a high electron injection property. The substance having a high electron injection property is, for example, a compound of alkaline earth metal or a compound of alkali metal such as lithium fluoride (LiF), cesium fluoride (CsF), or calcium fluoride (CaF$_2$). Further, in addition to these substances, a compound containing alkali metal or alkaline earth metal in a layer made of a substance having an electron transporting property, for example, a compound containing magnesium (Mg) in Alq$_3$, or the like can be used. As for the fifth layer 19, a single layer made of the above material may be provided or a plurality of layers made of the above materials may be stacked.

Next, a stacked structure of the monitoring light-emitting element 104 and the light-emitting element 107, which is different from the above, will be explained. Each of the monitoring light-emitting element 104 and the light-emitting element 107 is an element in which a first conductive layer 11, a first layer 20, a second layer 21, a third layer 22, and a second conductive layer 12 are stacked (refer to FIG. 2C).

The first layer 20 is a layer including a light-emitting substance. The first layer 20 is made of the same material as the second layer 14 and the third layer 17.

The second layer 21 is a layer including a substance having an electron donating property and a substance having an electron transporting property. The substance having an electron donating property is alkali metal, alkaline earth metal, oxide of alkali metal or alkaline earth metal, or salt of alkali metal or alkaline earth metal, and specifically, lithium, cesium, calcium, lithium oxide, calcium oxide, barium oxide, cesium carbonate, or the like. The substance having an electron transporting property is the substance described above.

The third layer 22 is a layer including an organic compound and an inorganic compound. The third layer 22 is made of the same material as the first layer 13 and the first layer 15 described above.

In the structure described above, electrons are donated and accepted in the vicinity of the interface between the second layer 21 and the third layer 22 by applying voltage, electrons and holes are generated, and the third layer 22 transports the holes to the second conductive layer 12 while the second layer 21 transports the electrons to the first layer 20. Therefore, the combination of the second layer 21 and the third layer 22 serves as a carrier generating layer. In addition, it can be said that the third layer 22 has a function of transporting holes to the second conductive layer 12.

Subsequently, a stacked structure of the monitoring light-emitting element 104 and the light-emitting element 107, which is different from the above, will be explained. Each of the monitoring light-emitting element 104 and the light-emitting element 107 is an element in which a first conductive layer 11, a first layer 23, a second layer 24, a third layer 25, a fourth layer 26, and a second conductive layer 12 are stacked (refer to FIG. 2D).

The first layer 23 is a layer including an organic compound and an inorganic compound. The first layer 23 is made of the same material as the first layer 13, the first layer 15, and the third layer 22 described above.

The second layer 24 is a layer including a light-emitting substance. The second layer 24 is made of the same material as the second layer 14, the third layer 17, and the first layer 20 described above.

The third layer 25 is a layer including a substance having an electron donating property and a substance having an electron transporting property. The third layer 25 is made of the same material as the second layer 21 described above.

The fourth layer 26 is a layer including an organic compound and an inorganic compound. The fourth layer 26 is made of the same material as the first layer 13, the first layer 15, and the third layer 22 described above.

As described above, the monitoring light-emitting element 104 and the light-emitting element 107 have at least two layers of a layer including an organic compound and an inorganic compound and a layer including a light-emitting substance. At least these two layers are provided between the first conductive layer 11 and the second conductive layer 12. In addition to these two layers, layers made of a substance having a high electron transporting property, a substance having a high hole transporting property, a substance having a high electron injection property, a substance having a high hole injection property, a bipolar (substance having a high transporting property of an electron and a hole) substance, or the like are provided.

In the monitoring light-emitting element 104 and the light-emitting element 107, a current flows by electric potential difference generated between the first conductive layer 11 and the second conductive layer 12. In the layer including a light-emitting substance, a hole and an electron are recombined to emit light. Light emission of the light-emitting element is extracted outward through one or both of the first conductive layer 11 and the second conductive layer 12. Therefore, one or both of the first conductive layer 11 and the second conductive layer 12 is/are made of a substance having a light-transmitting property. As light emitted from the light-emitting element, there are light emission (fluorescence) which is generated in returning from a singlet excited state to a ground state and light emission (phosphorescence) which is generated in returning from a triplet excited state to a ground state.

The layer including an organic compound and an inorganic compound shows an extremely high hole injection property and hole transporting property. Hence, by using the layer including an organic compound and an inorganic compound, a voltage value applied between both electrodes of the light-emitting element can be reduced. Therefore, power consumption can be reduced.

Further, the layer including an organic compound and an inorganic compound has a low resistance value compared with another layer made of an organic compound. For example, the resistance value of a material containing α-NPB and molybdenum oxide, in which a weight ratio of the A-NPB to the molybdenum oxide is 1:0.5, is $3.1 \times 10^5 \Omega$. Therefore, the resistance value of the light-emitting element itself is not increased even if the layer including an organic compound and an inorganic compound is formed to be thick. In other words, a voltage value (hereinafter, also referred to as drive voltage) applied to both electrodes of the light-emitting element is not increased even if the layer including an organic compound and an inorganic compound is formed to be thick.

Further, since the resistance value of the layer including an organic compound and an inorganic compound is low, a short-circuit portion due to dust, impact, or the like can be prevented from being generated by providing a thick layer. As a result, a light-emitting element with high reliability can be provided.

For example, a total thickness of a first conductive layer, a second conductive layer, and a layer provided between the first conductive layer and the second conductive layer of the light-emitting element using the layer including an organic compound and an inorganic compound can be 100 nm to 500 nm, preferably, 200 nm to 500 nm, whereas a total thickness of a first conductive layer, a second conductive layer, and a layer provided between the first conductive layer and the second conductive layer of a normal light-emitting element is 100 nm to 150 nm. In addition, the layer including an organic compound and an inorganic compound can be formed to have a film thickness of 40 nm or more, preferably, 80 nm or more, and more preferably, 100 nm or more.

Further, since there is no influence on a drive voltage of the light-emitting element even if the layer including an organic compound and an inorganic compound is formed to be thick, the thickness of the layer including an organic compound and an inorganic compound can be freely set. Therefore, light extraction efficiency from the light-emitting element and color purity can be improved by optimizing a thickness of the layer.

The layer including an organic compound and an inorganic compound is formed by co-evaporation. The co-evaporation is a method for conducting evaporation using two or more evaporation sources, and an inorganic compound is put in one evaporation source and an organic compound is put in another evaporation source. Thus, the layer including an organic compound and an inorganic compound can be formed by an evaporation method in the same manner as another layer included in the light-emitting element. Therefore, by putting the substrate on which the first conductive layer is formed into a vacuum metallizer after forming the first conductive layer of the light-emitting element on the substrate, all layers except for the layer including an organic compound and an inorganic compound can be formed continuously. Hence, the generation of dust can be prevented and the interface between layers can be kept clean. It is to be noted that a layer except for the layer including an organic compound and an inorganic compound may be formed by an ink-jet method, a spin coating method, or the like instead of an evaporation method.

Embodiment 1

A panel which is one mode of a display device of the present invention will be explained with reference to FIGS. 3A and 3B and FIGS. 4A and 4B. The panel includes a monitor portion 101, a pixel portion 102 including a light-emitting element 107 and a driving transistor 108, a constant current source 110, a circuit 111, a source driver 113 including a plurality of elements 125, and a gate driver 114, which are provided between a substrate 10 and an opposing substrate 30. In addition, the panel includes a connection film 122 provided on the substrate 10. The connection film 122 is connected to a plurality of ICs provided outside. The line A-B in a perspective view of FIG. 3A corresponds to lines A-B in cross-sectional views of FIG. 3B, and FIGS. 4A and 4B. It is to be noted that the circuit 111 is omitted in the cross-sectional view.

A sealing member 123 is provided in the periphery of the monitor portion 101, the pixel portion 102, the constant current source 110, the circuit 111, the source driver 113, and the gate driver 114, and by the sealing member 123 and the opposing substrate 30, a plurality of circuits on the substrate 10 is sealed. This sealing process is a process for protecting the light-emitting element 107 from moisture, and here, a method for sealing by a cover member (glass, ceramics, plastic, metal, or the like) is used. However, a method for sealing by a thermosetting resin or an ultraviolet light curable resin or a method for sealing by a thin film having high barrier ability such as metal oxide or nitride may be also used.

In the case where a first conductive layer 11 (also referred to as pixel electrode) of the light-emitting element 107 has a light-transmitting property and a second conductive layer 12

Figure 3A:
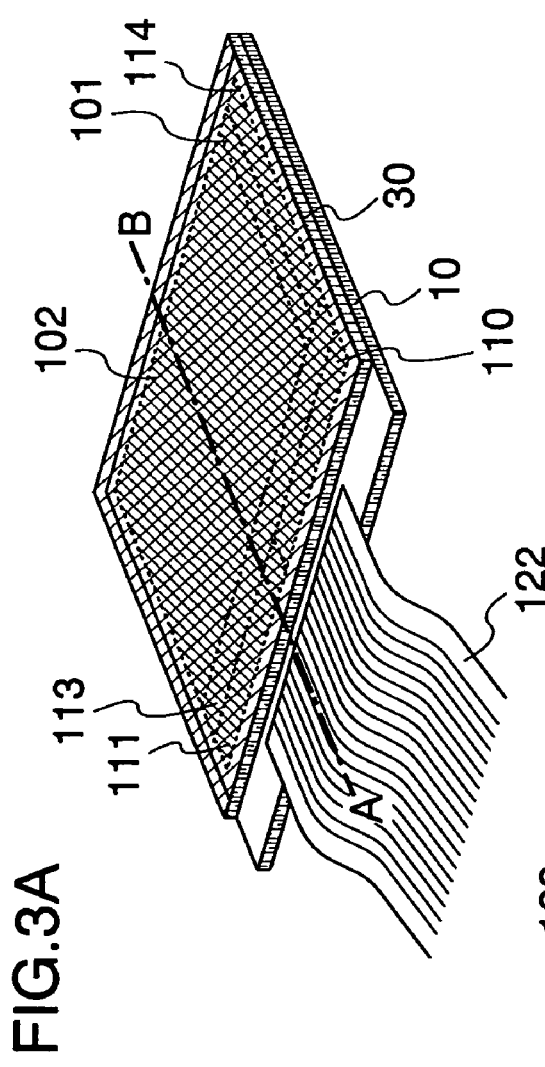
FIGS. 3A and 3B are views showing a display device of the invention.
Figure 3B:
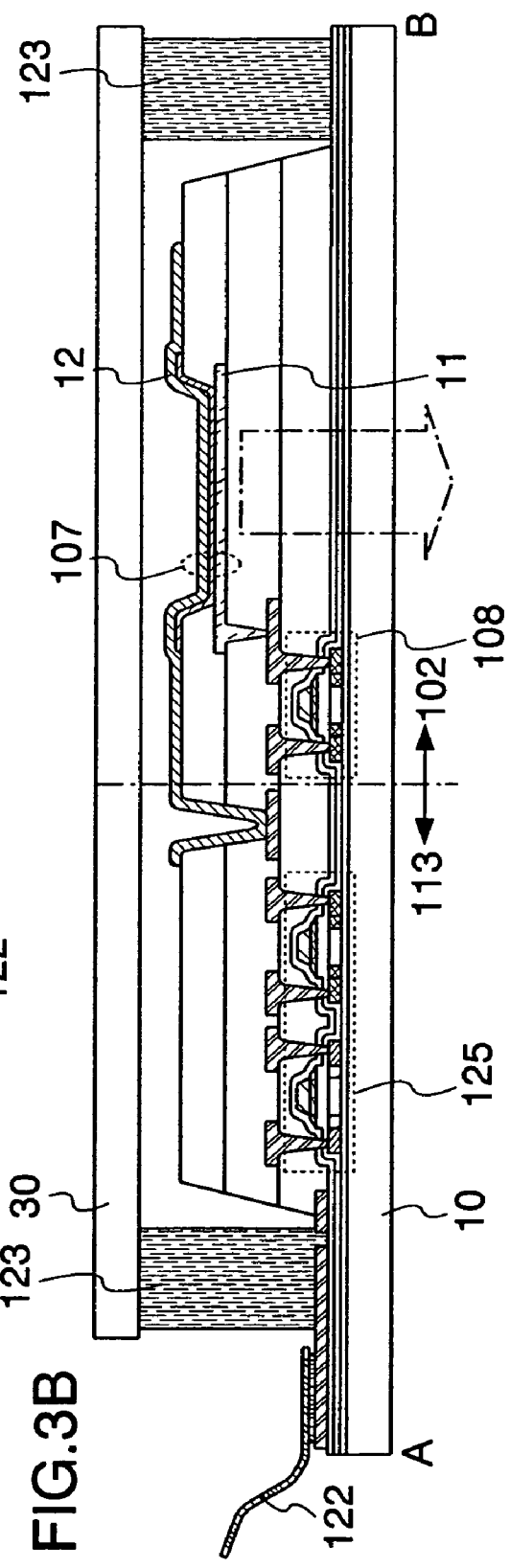
Figure 5:
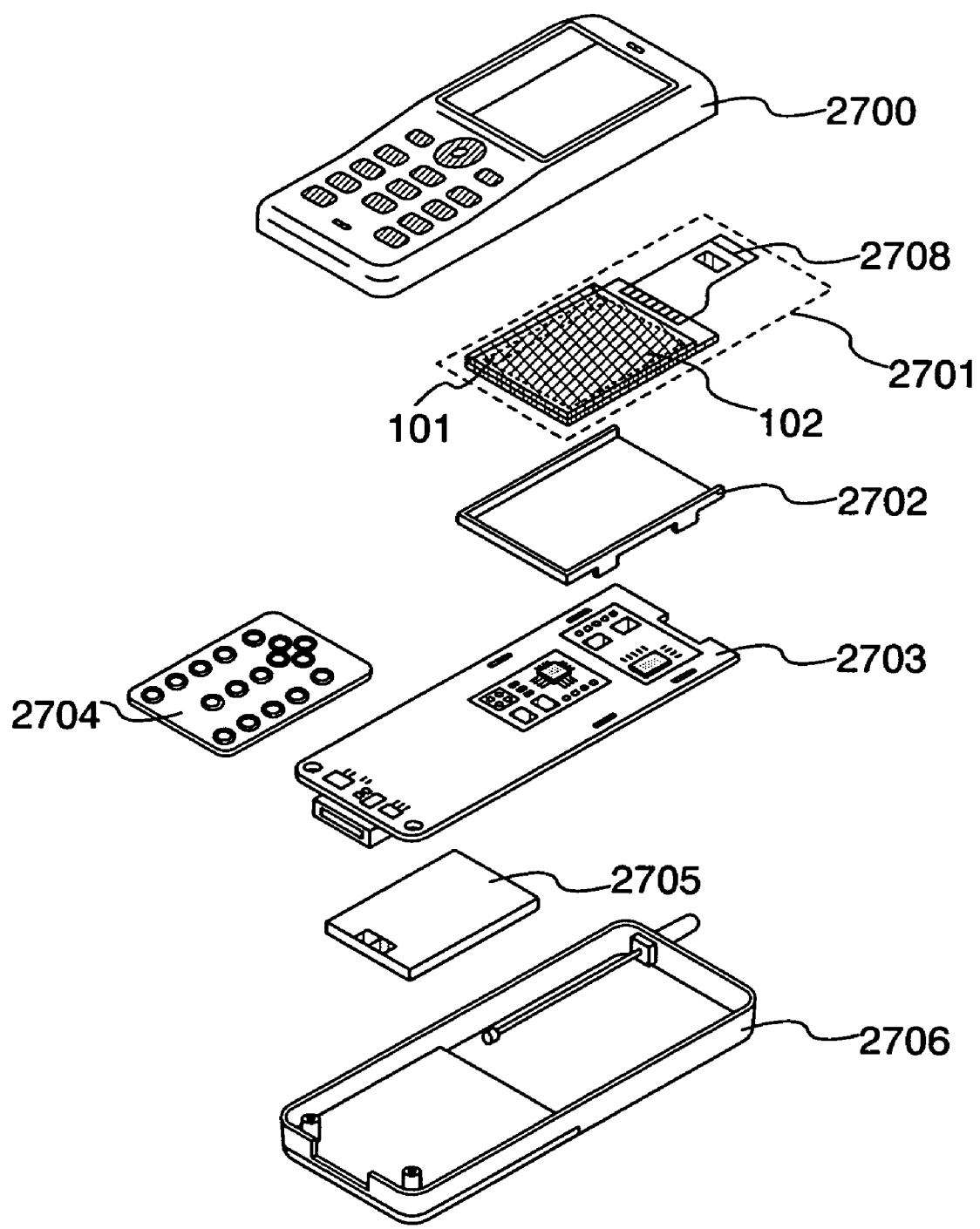
FIG. 5 is a view showing a display device of the invention.

(also referred to as opposite electrode) of the light-emitting element 107 has a light-shielding property, the light-emitting element 107 is a bottom emission type (refer to FIG. 3B).

Alternatively, in the case where the first conductive layer 11 of the light-emitting element 107 has a light-shielding property and the second conductive layer 12 of the light-emitting element 107 has a light-transmitting property, the light-emitting element 107 is a top emission type (refer to FIG. 4A). Further alternatively, in the case where both of the first conductive layer 11 of the light-emitting element 107 and the second conductive layer 12 of the light-emitting element 107 have a light-transmitting property, the light-emitting element 107 is a dual emission type (refer to FIG. 4B).

In bottom emission, the light-emitting element 107 emits light in a direction of the substrate 10. In top emission, the light-emitting element 107 emits light in a direction of the opposing substrate 30. Further, in dual emission, the light-emitting element 107 emits light in a direction of the substrate 10 and a direction of the opposing substrate 30.

Further, the first conductive layer 11 of the light-emitting element 107 may be provided on an insulating layer which is provided on a source wiring and a drain wiring of the driving transistor 108 (refer to FIG. 3B), or the first conductive layer 11 of the light-emitting element 107 may be provided in the same layer as the source wiring and the drain wiring of the driving transistor 108 (refer to FIGS. 4A and 4B). Furthermore, in a portion where the source wiring or the drain wiring of the driving transistor 108 and the first conductive layer 11 of the light-emitting element 107 are stacked, the source wiring or the drain wiring of the driving transistor 108 may be a lower layer and the first conductive layer 11 of the light-emitting element 107 may be an upper layer (refer to FIG. 4A). Alternatively, the first conductive layer 11 of the light-emitting element 107 may be a lower layer and the source wiring or the drain wiring of the driving transistor 108 may be an upper layer (refer to FIG. 4B).

In a step of forming the first conductive layer 11 by a photolithography method, especially in a step of etching the first conductive layer 11, isopropyl alcohol (IPA) is preferably used. Accordingly, damage to the source wiring or the drain wiring of the driving transistor 108 and the first conductive layer 11 can be reduced.

An element provided on the substrate 10 may be formed by a thin film transistor in which a crystalline semiconductor with favorable characteristics such as mobility is used for a channel portion. Thus, monolithic integration in which a plurality of elements is provided on the same surface can be realized. According to a display device having the structure described above, the number of external ICs which are to be connected can be reduced; therefore, small size, thin shape, and lightweight can be realized.

Further, the monitor portion 101 and the pixel portion 102 may be formed by a thin film transistor (preferably, a thin film transistor in which an amorphous semiconductor is used for a channel portion) provided on the substrate 10, and the constant current source 110, the circuit 111, the source driver 113, and the gate driver 114 may be formed by an IC chip. The IC chip may be attached to the substrate 10 by a COG method or attached to the connection film 122. An inexpensive display device can be provided because an amorphous semiconductor can be easily formed on a large-sized substrate by using a CVD method and a crystallization step is unnecessary. Furthermore, in this case, a more inexpensive display device can be provided by forming a conductive layer by a droplet discharging method typified by an ink-jet method.

Embodiment 2

One mode of an electronic device using a display device of the present invention will be explained with reference to FIG. 5 and FIGS. 6A to 6F. The electronic device illustrated here is a cellular phone unit, which includes chassis 2700 and 2706, a panel 2701, a housing 2702, a printed wiring board 2703, operation buttons 2704, and a battery 2705 (refer to FIG. 5). The panel 2701 has a monitor portion 101 and a pixel portion 102, and these circuits are sealed by a pair of substrates. The panel 2701 is incorporated in the housing 2702 to be detachable, and the housing 2702 is fixed to the printed wiring board 2703. As for the housing 2702, a shape and a size thereof are appropriately changed depending on an electronic device in which the panel 2701 is incorporated. A plurality of IC chips corresponding to a central processing circuit (CPU), a controller circuit, a constant current source 110, a circuit 111, a source driver 113, a gate driver 114, and the like are mounted on the printed wiring board 2703.

The printed wiring board 2703 is mounted to the panel 2701 through a connection film 2708. A state where the printed wiring board 2703 is mounted to the panel 2701 as described above is referred to as a module. The panel 2701, the housing 2702, and the printed wiring board 2703 are stored inside the chassis 2700 and 2706 with the operation buttons 2704 and the battery 2705. A pixel region included in the panel 2701 is disposed so as to be visually recognized by an aperture provided in the chassis 2700.

It is to be noted that chassis 2700 and 2706 are shown as one example of an appearance shape of the cellular phone unit, and an electronic device using a display device of the present invention can be changed into various modes in accordance with a function or an application thereof. For example, a display device of the invention can be used for various electronic devices such as a cellular phone unit (also referred to as cellular phone handset or cellular phone), PDA, an electronic notebook, and a portable game machine, which are portable terminals; a television device (also referred to as television or television receiver); a display (also referred to as monitor device); a camera such as a digital camera or a digital video camera; a sound-reproducing device such as a car audio set; a home-use game machine; and the like. Hereinafter, examples of modes of these electronic devices will be explained with reference to FIGS. 6A to 6F.

Figure 6A:
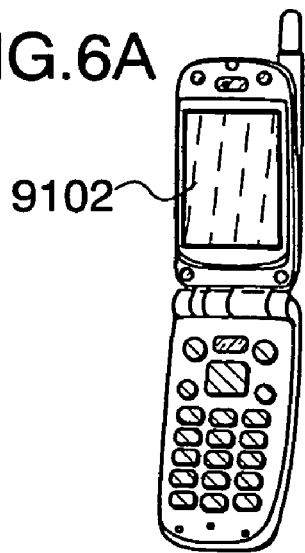
FIGS. 6A to 6F are views showing display devices of the invention.
Figure 6B:
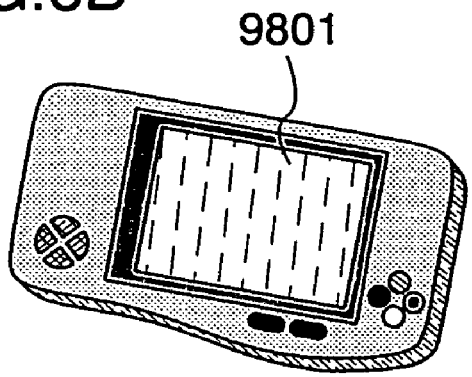
Figure 6C:
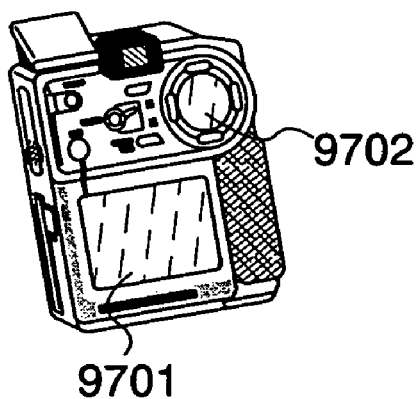
Figure 6D:
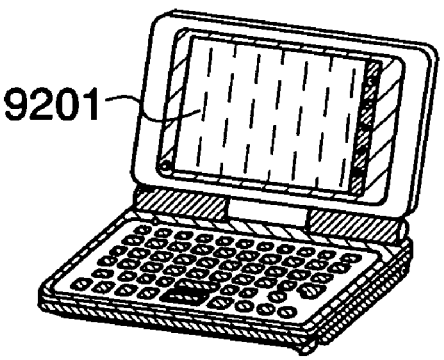
Figure 6E:
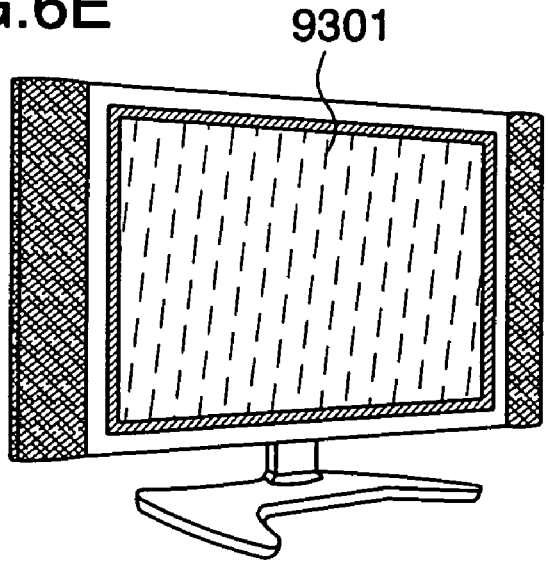
Figure 6F:
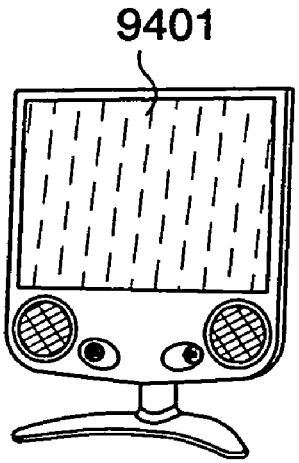

A cellular phone unit, which is a portable terminal, includes a pixel portion 9102 and the like (refer to FIG. 6A). A portable game machine, which is a portable terminal, includes a pixel portion 9801 and the like (refer to FIG. 6B). A digital video camera includes pixel portions 9701 and 9702 and the like (refer to FIG. 6C). A PDA (personal digital assistant), which is a portable information terminal, includes a pixel portion 9201 and the like (refer to FIG. 6D). A television device includes a pixel portion 9301 and the like (refer to FIG. 6E). A monitor device includes a pixel portion 9401 and the like (refer to FIG. 6F). This embodiment can be freely combined with another embodiment mode or embodiment.

Embodiment 3

In this embodiment, an experimental result of examining a change of characteristics in operating a sample (three samples: samples A to C) including a light-emitting element and a monitoring light-emitting element at room temperature will be explained with reference to FIG. 7 to 10A and 10B.

Each of the samples A to C includes the light-emitting element and the monitoring light-emitting element. Each of the light-emitting element and the monitoring light-emitting element has a structure in which a first conductive layer (anode), a first layer (hole injecting layer), a second layer (hole transporting layer), a third layer (light-emitting layer), a fourth layer (electron transporting layer), a fifth layer (electron injecting layer), and a second conductive layer (cathode) are stacked in this order from a lower layer side. In each sample, the light-emitting element and the monitoring light-emitting element have the same stacked structure.

In the light-emitting element and the monitoring light-emitting element of the sample A, indium tin oxide was formed as a first conductive layer; a layer made of α-NPB, molybdenum oxide, and rubrene, in which the weight ratio of α-NPB, molybdenum oxide, and rubrene is 1:0.1:0.4, was formed to be 120 nm in thickness as a first layer. α-NPB was formed to be 40 nm in thickness as a second layer, and a layer made of $Alq_3$ and coumarin 6, in which the weight ratio of $Alq_3$ to coumarin 6 is 1:0.05, was formed to be 40 nm in thickness as a third layer. $Alq_3$ was formed to be 30 nm in thickness as a fourth layer, lithium fluoride was formed to be 1 nm in thickness as a fifth layer, and aluminum was formed as a second conductive layer. Initial luminance of the sample A was 316.0 $cd/m^2$, initial intrinsic luminance was 770.7 $cd/m^2$, initial current was 72.7 mA, initial electric potential of the first conductive layer was 6.2 V, and electric potential of the second conductive layer was 0V. The initial intrinsic luminance was obtained by multiplying the initial luminance by an aperture rate of each sample.

In the light-emitting element and the monitoring light-emitting element of the sample B, indium tin oxide was formed as a first conductive layer, and a layer made of DNTPD and molybdenum oxide, in which the weight ratio of DNTPD to molybdenum oxide is 1:0.5, was formed to be 120 nm in thickness as a first layer. α-NPB was formed to be 40 nm in thickness as a second layer, and a layer made of $Alq_3$ and coumarin 6, in which the weight ratio of $Alq_3$ to coumarin 6 is 1:0.05, was formed to be 40 nm in thickness as a third layer. $Alq_3$ was formed to be 30 nm in thickness as a fourth layer, lithium fluoride was formed to be 1 nm in thickness as a fifth layer, and aluminum was formed as a second conductive layer. Initial luminance of the sample B was 306.0 $cd/m^2$, initial intrinsic luminance was 746.3 $cd/m^2$, initial current was 65.0 mA, initial electric potential of the first conductive layer was 6.1 V, and electric potential of the second conductive layer was 0V.

In the light-emitting element and the monitoring light-emitting element of the sample C, indium tin oxide was formed as a first conductive layer; a layer made of CuPc was formed to be 20 nm in thickness as a first layer, and α-NPB was formed to be 40 nm in thickness as a second layer. A layer made of $Alq_3$ and coumarin 6, in which the weight ratio of $Alq_3$ to coumarin 6 is 1:0.05, was formed to be 40 nm in thickness as a third layer. $Alq_3$ was formed to be 30 nm in thickness as a fourth layer, lithium fluoride was formed to be 1 nm in thickness as a fifth layer, and aluminum was formed as a second conductive layer. Initial luminance of the sample C was 327.0 $cd/m^2$, initial intrinsic luminance was 797.6 $cd/m^2$, initial current was 76.0 mA, initial electric potential of the first conductive layer was 7.5 V, and electric potential of the second conductive layer was 0V.

The materials for the first layers of the samples A to C are different from each other, and the materials for other layers were the same. In each of the samples A to C, stress conditions of the light-emitting element and the monitoring light-emitting element were the same. More specifically, during the experiment, the light-emitting element and the monitoring light-emitting element were emitting at all times, and the light-emitting element and the monitoring light-emitting element had the same momentary current value. In other words, "stress condition is the same" means that the total amount of current in the light-emitting element and the monitoring light-emitting element for a certain period of time is the same. That is, under this condition, the ratio of the total amount of current in the light-emitting element to the total amount of current in the monitoring light-emitting element is 1:1.

Next, relation between time and each of a voltage value of the first conductive layer, standardized current, standardized luminance, and standardized current luminance efficiency of the samples A to C, respectively, will be explained. The standardized current means a current (%) at the time when initial current is set to be 100%. The standardized luminance means luminance (%) at the time when initial luminance is set to be 100%. The standardized current luminance efficiency means current luminance efficiency (%) at the time when initial current luminance efficiency is set to be 100%.

First, relation between an electric potential (V, right vertical axis) of the first conductive layer (anode) and time (hour, a horizontal axis) will be explained with reference to FIG. 7. FIG. 7 shows that the electric potential of the first conductive layer is increased with time in all the samples A to C. This is because the monitoring light-emitting elements of all the samples are changed with time and resistance values of the monitoring light-emitting elements are increased with time. It is to be noted that the samples A and B show almost the same increasing tendency.

Subsequently, relation between a standardized current (%, left vertical axis) and time (hour, horizontal axis) will be explained with reference to FIG. 7. FIG. 7 shows that a standardized current in the samples A and B is hardly changed with time and a standardized current in the sample C is increased with time. As described above, the light-emitting element and the monitoring light-emitting element are under the same stress condition, and accordingly, the light-emitting element and the monitoring light-emitting element have the same progress of the change with time in the samples A and B, and the monitoring light-emitting element has more rapid progress of the change with time than the light-emitting element in the sample C.

Figure 8:
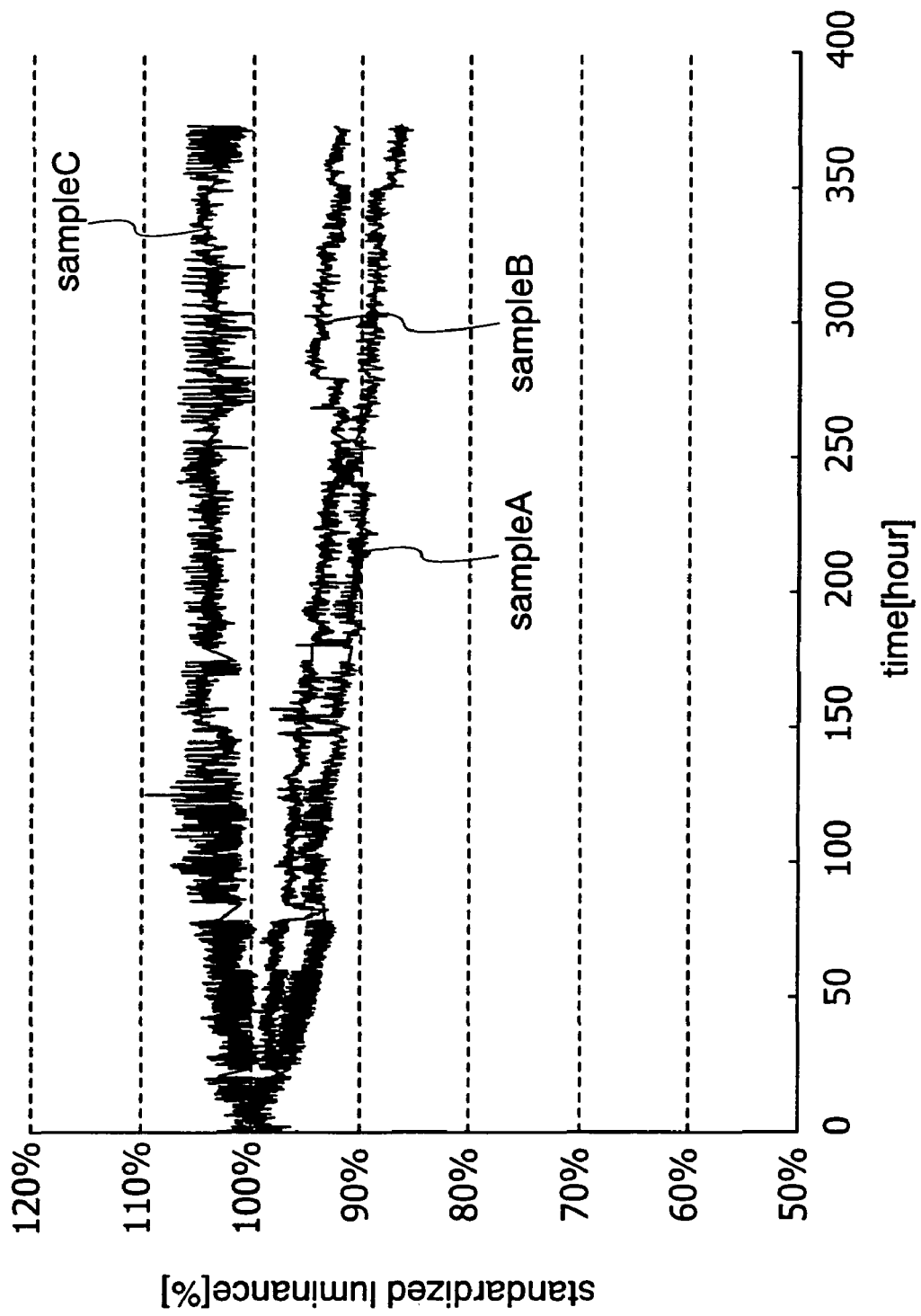
FIG. 8 is a graph showing a result of experiment.

Next, relation between standardized luminance (%, vertical axis) and time (hour, horizontal axis) will be explained with reference to FIG. 8. FIG. 8 shows that standardized luminance in the samples A and B is decreased with time, and standardized luminance in the sample C is hardly changed. The standardized luminance in the sample C is hardly changed because a standardized current is increased in the sample C as described above.

Figure 9:
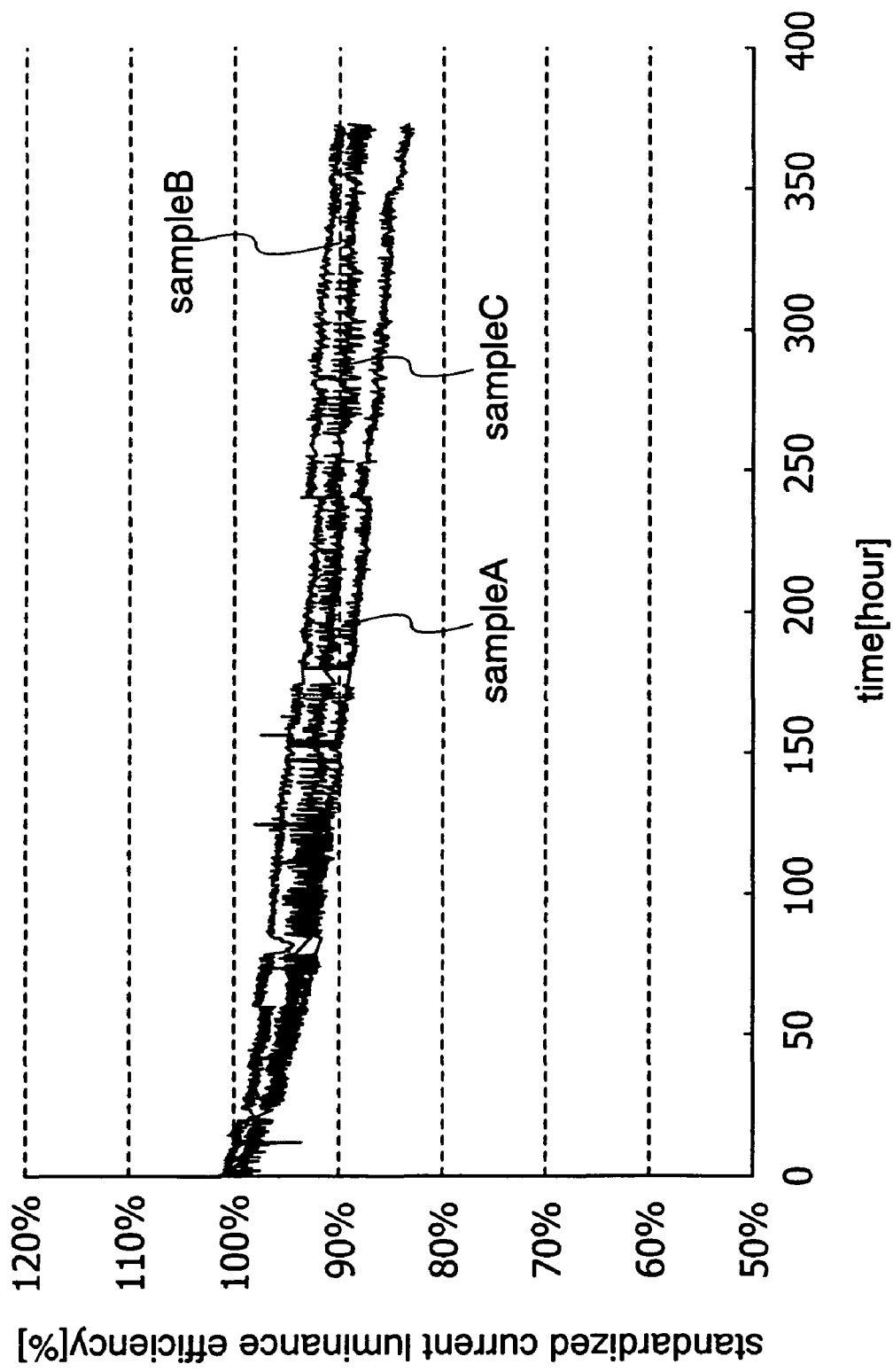
FIG. 9 is a graph showing a result of experiment.

Next, relation between standardized current luminance efficiency and time will be explained with reference to FIG. 9. FIG. 9 shows that standardized current luminance efficiency is decreased with time in all the samples A to C.

From the above results, the light-emitting element and the monitoring light-emitting element have the same progress of the change with time in the samples A and B, and the light-emitting element and the monitoring light-emitting element have different progress of the change with time in the sample C. A difference between the samples A and B and the sample C is that a material including an organic compound and an inorganic compound is used for the first layer in the samples A and B, and alternatively, only an organic compound is used for the first layer in the sample C. Therefore, it is revealed that the progress of the change with time in the light-emitting element and the monitoring light-emitting element can be made to be the same by using the material including an organic compound and an inorganic compound for the first layer. Hence, when each of the light-emitting element and the monitoring light-emitting element has the layer including an organic compound and an inorganic compound, the electric potential transmitted to the light-emitting element can be corrected accurately using the monitoring light-emitting element.

Figure 10A:
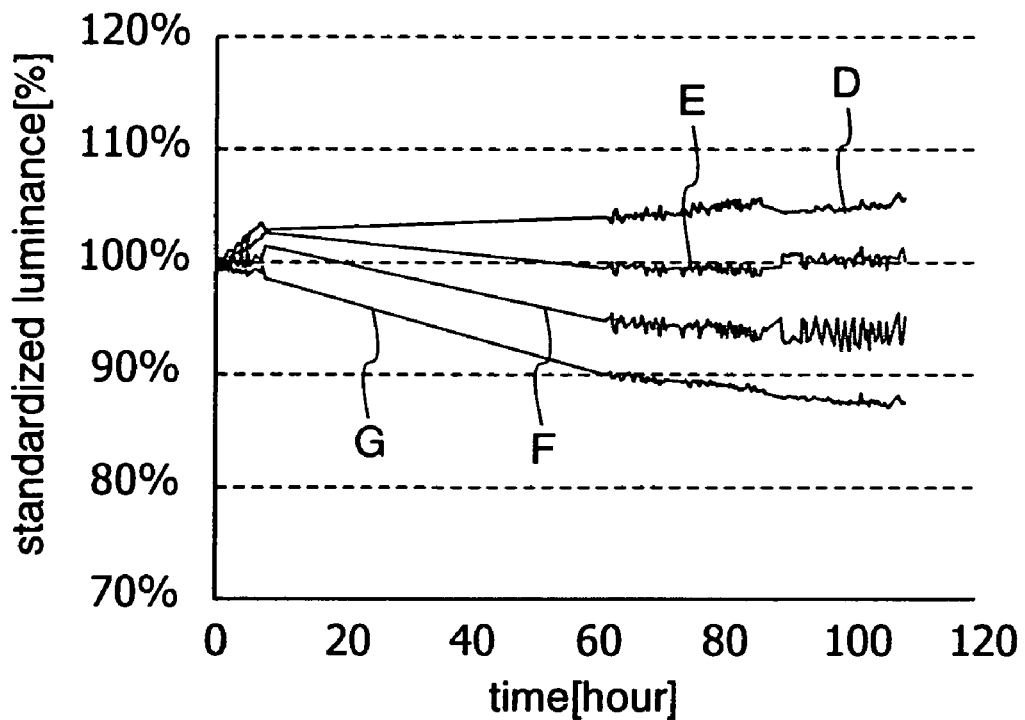
FIGS. 10A and 10B are graphs each showing a result of experiment.
Figure 10B:
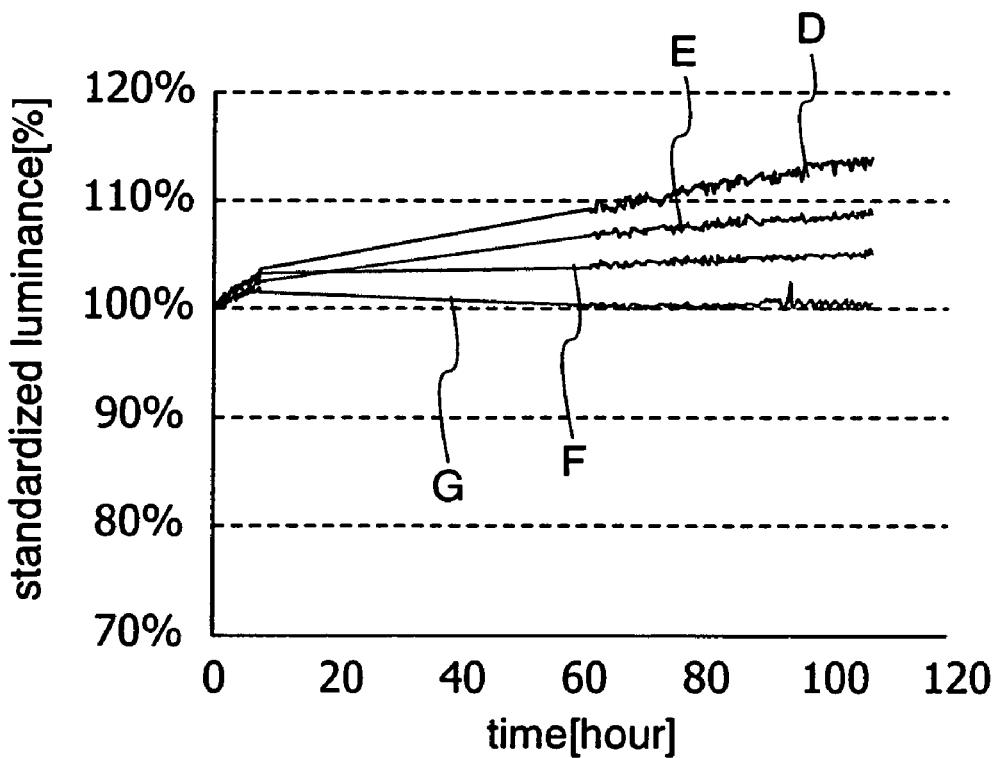

Subsequently, relation between time and standardized luminance of the light-emitting element will be explained with reference to FIGS. 10A and 10B, when lighting rate of the light-emitting element is set to 25% (indicated by D in FIGS. 10A and 10B), 50% (indicated by E in FIGS. 10A and 10B), 75% (indicated by F in FIGS. 10A and 10B), and 100% (indicated by G in FIGS. 10A and 10B), and lighting rate of the monitoring light-emitting element is set to 100%.

Lighting rate denotes rate of lighting time in the light-emitting element. "Lighting rate of the light-emitting element is 100%" means that the light-emitting element is lighted at all times during a certain period of time (here, one frame period). "Lighting rate of the light-emitting element is 75%" means that the light-emitting element is lighted during 75% of one frame period. "Lighting rate of the light-emitting element is 50%" means that the light-emitting element is lighted during 50% of one frame period. "Lighting rate of the light-emitting element is 25%" means that the light-emitting element is lighted during 25% of one frame period.

First, relation between standardized luminance (%, vertical axis) and time (hour, horizontal axis) of the sample B will be explained with reference to FIG. 10A. FIG. 10A shows that luminance of the light-emitting element is the most constant when lighting rate of the light-emitting element is set to 50% and lighting rate of the monitoring light-emitting element is set to 100%.

Further, relation between standardized luminance (%, vertical axis) and time (hour, horizontal axis) of the sample C will be explained with reference to FIG. 10B. FIG. 10B shows that luminance of the light-emitting element is the most constant when lighting rate of the light-emitting element is set to 100% and lighting rate of the monitoring light-emitting element is set to 100%.

From the above results, it is revealed that luminance of the light-emitting element is the most constant in the sample B when an image with lighting rate of 50% is displayed using the light-emitting element. In addition, it is revealed that luminance of the light-emitting element is the most constant in the sample C when an image with lighting rate of 100% is displayed using the light-emitting element.

This application is based on Japanese Patent Application serial No. 2005-113054 field in Japan Patent Office on Apr. 11, 2005, the entire contents of which are hereby incorporated by reference.

What is claimed is:

1. A display device comprising:
a constant current source for supplying a constant current;
an amplifier;
a monitoring portion including a first monitoring pixel and a second monitoring pixel,
the first monitoring pixel including:
a first light-emitting element; and
a first transistor, one of a source and a drain of the first transistor being electrically connected to a first electrode of the first light-emitting element, and the other of the source and the drain of the first transistor being electrically connected to the constant current source and a noninverting input terminal of the amplifier;
the second monitoring pixel including:
a third light-emitting element; and
a third transistor, one of a source and a drain of the third transistor being electrically connected to a first electrode of the third light-emitting element, the other of the source and the drain of the third transistor being electrically connected to the constant current source and the noninverting input terminal of the amplifier, and a gate of the third transistor being electrically connected to a gate of the first transistor;
a pixel portion including a pixel;
the pixel including:
a second light-emitting element; and
a second transistor, one of a source and a drain of the second transistor being electrically connected to a first electrode of the second light emitting element, and the other of the source and the drain of the second transistor being electrically connected to an inverting input terminal and an output terminal of the amplifier,
wherein a second electrode of the first light-emitting element, a second electrode of the second light-emitting element, and a second electrode of the third light-emitting element are held at a constant electric potential,
wherein each of the first light-emitting element, the second light-emitting element, and the third light-emitting element has a first layer and a second layer formed between the first electrode and the second electrode,
wherein the first layer contains a composite material including an organic compound and an inorganic compound, and
wherein the second layer contains a light-emitting substance.

2. A display device according to claim 1,
wherein the organic compound is 4,4'-bis[N-(1-naphthyl)-N-phenylamino]biphenyl, 4,4'-bis[N-(3-methylphenyl)-N-phenylamino]biphenyl, 4,4',4''-tris(N,N-diphenylamino) triphenylamine, 4,4',4''-tris[N-(3-methylphenyl)-N-phenylamino]triphenylamine, 4,4'-bis{N-[4-(N,N-di-m-tolylamino)phenyl]-N-phenylamino}biphenyl, 1,3,5-tris[N,N-di(m-tolyl)amino]benzene, 4,4'-bis[N-(4-biphenylyl)-N-phenylamino]biphenyl, 4,4',4''-tris(N-carbazolyl) triphenylamine, 3-[N-(9-phenylcarbazol-3-yl)-N-phenylamino]-9-phenylcarbazole, 3,6-bis[N-(9-phenylcarbazol-3-yl)-N-phenylamino]-9-phenylcarbazole, phthalocyanine, copper phthalocyanine, vanadyl phthalocyanine, or 5,6,11,12-tetraphenyl naphthacene.

3. A display device according to claim 1,
wherein the inorganic compound is zirconium oxide, hafnium oxide, vanadium oxide, niobium oxide, tantalum oxide, chromium oxide, molybdenum oxide, tungsten oxide, titanium oxide, manganese oxide, or rhenium oxide.

4. A display device according to claim 1,
wherein the light-emitting substance is one or more kinds of substances selected from N,N'-dimethylquinacridone, 3-(2-benzothiazoyl)-7-diethylamino coumarin, tris(8-quinolinolato) aluminum, and 9,10-di(2-naphthyl) anthracene.

5. A display device according to claim 1,
wherein the first layer and the second layer are stacked and the first layer is provided over the second layer.

6. A display device according to claim 1,
wherein the first layer and the second layer are stacked and the second layer is provided over the first layer.

7. A display device according to claim 1,
wherein the second electrode of the first light-emitting element and the second electrode of the second light-emitting element are electrically connected to a wiring.

8. A display device according to claim 1,
wherein the second electrode of the first light-emitting element and the second electrode of the second light-emitting element are electrically connected to a power source through a wiring.

9. A display device according to claim 1,
wherein the amplifier is a buffer amplifier, an operational amplifier, or a sense amplifier.

10. A display device according to claim 1,
wherein a value (X/Y) obtained by dividing total amount of current X of the first light-emitting element by total amount of current Y of the second light-emitting element is 1 or more to 5 or less.

11. A display device according to claim 1,
wherein the first light-emitting element and the second light-emitting element are provided on a same insulating surface.

12. A display device according to claim 1,
wherein the first light-emitting element, the second light-emitting element, the constant current source, and the amplifier are provided on a same insulating surface.

13. An electronic device using the display device according to claim 1.

14. A display device comprising:
a constant current source for supplying a constant current;
an amplifier;
a monitoring portion including a first monitoring pixel and a second monitoring pixel,
the first monitoring pixel including:
 a first light-emitting element; and
 a first transistor, one of a source and a drain of the first transistor being electrically connected to a first electrode of the first light-emitting element, and the other of the source and the drain of the first transistor being electrically connected to the constant current source and a noninverting input terminal of the amplifier;
the second monitoring pixel including:
 a third light-emitting element; and
 a third transistor, one of a source and a drain of the third transistor being electrically connected to a first electrode of the third light-emitting element, the other of the source and the drain of the third transistor being electrically connected to the constant current source and the noninverting input terminal of the amplifier, and a gate of the third transistor being electrically connected to a gate of the first transistor;
a pixel portion including a pixel;
the pixel including:
 a second light-emitting element; and
 a second transistor, one of a source and a drain of the second transistor being electrically connected to a first electrode of the second light emitting element, and the other of the source and the drain of the second transistor being electrically connected to an inverting input terminal and an output terminal of the amplifier,
wherein the gate of the first transistor and the gate of the third transistor are held at a constant electric potential which turns on the first transistor and the third transistor,
wherein a second electrode of the first light-emitting element, a second electrode of the second light-emitting element, and a second electrode of the third light-emitting element are held at a constant electric potential,
wherein the second electrode of the first light-emitting element and the second electrode of the third light-emitting element are electrically connected to the second electrode of the second light-emitting element,
wherein each of the first light-emitting element, the second light-emitting element, and the third light-emitting element has a first layer and a second layer formed between the first electrode and the second electrode,
wherein the first layer contains a composite material including an organic compound and an inorganic compound, and
wherein the second layer contains a light-emitting substance.

15. A display device according to claim 14,
wherein the organic compound is 4,4'-bis[N-(1-naphthyl)-N-phenylamino]biphenyl, 4,4'-bis[N-(3-methylphenyl)-N-phenylamino]biphenyl, 4,4',4"-tris(N, N-diphenylamino) triphenylamine, 4,4',4"-tris[N-(3-methylphenyl)-N-phenylamino]triphenylamine, 4,4'-bis{N-[4-(N,N-di-m-tolylamino)phenyl]-N-phenylamino}biphenyl, 1,3,5-tris[N,N-di(m-tolyl)amino]benzene, 4,4'-bis[N-(4-biphenylyl)-N-phenylamino]biphenyl, 4,4',4"-tris(N-carbazolyl) triphenylamine, 3-[N-(9-phenylcarbazol-3-yl)-N-phenylamino]-9-phenylcarbazole, 3,6-bis[N-(9-phenylcarbazol-3-yl)-N-phenylamino]-9-phenylcarbazole, phthalocyanine, copper phthalocyanine, vanadyl phthalocyanine, or 5,6,11,12-tetraphenyl naphthacene.

16. A display device according to claim 14,
wherein the inorganic compound is zirconium oxide, hafnium oxide, vanadium oxide, niobium oxide, tantalum oxide, chromium oxide, molybdenum oxide, tungsten oxide, titanium oxide, manganese oxide, or rhenium oxide.

17. A display device according to claim 14,
wherein the light-emitting substance is one or more kinds of substances selected from N,N'-dimethylquinacridone, 3-(2-benzothiazoyl)-7-diethylamino coumarin, tris(8-quinolinolato) aluminum, and 9,10-di(2-naphthyl) anthracene.

18. A display device according to claim 14,
wherein the first layer and the second layer are stacked and the first layer is provided over the second layer.

19. A display device according to claim 14,
wherein the second electrode of the first light-emitting element and the second electrode of the second light-emitting element are electrically connected to a wiring.

20. A display device according to claim 14,
wherein the second electrode of the first light-emitting element and the second electrode of the second light-emitting element are electrically connected to a power source through a wiring.

21. A display device according to claim 14,
wherein the amplifier is a buffer amplifier, an operational amplifier, or a sense amplifier.

22. A display device according to claim 14,
wherein a value (X/Y) obtained by dividing total amount of current X of the first light-emitting element by total amount of current Y of the second light-emitting element is 1 or more to 5 or less.

23. A display device according to claim 14,
wherein the first light-emitting element and the second light-emitting element are provided on a same insulating surface.

24. A display device according to claim 14, wherein the first light-emitting element, the second light-emitting element, the constant current source, and the amplifier are provided on a same insulating surface.

25. An electronic device using the display device according to claim 14.

* * * * *